(12) United States Patent
Kanev et al.

(10) Patent No.: US 12,196,779 B2
(45) Date of Patent: Jan. 14, 2025

(54) PROBE SYSTEM AND MACHINE APPARATUS THEREOF

(71) Applicant: MPI CORPORATION, Hsinchu County (TW)

(72) Inventors: Stojan Kanev, Hsinchu County (TW); Mei-Ting Lu, Hsinchu County (TW); Sebastian Giessmann, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 246 days.

(21) Appl. No.: 17/888,500

(22) Filed: Aug. 16, 2022

(65) Prior Publication Data

US 2023/0059740 A1  Feb. 23, 2023

Related U.S. Application Data

(60) Provisional application No. 63/234,677, filed on Aug. 18, 2021.

(51) Int. Cl.
*G01R 1/067* (2006.01)
*G01B 11/26* (2006.01)
*G01R 1/18* (2006.01)
*G01R 31/28* (2006.01)
*G06T 7/33* (2017.01)
(Continued)

(52) U.S. Cl.
CPC .......... *G01R 1/06772* (2013.01); *G01B 11/26* (2013.01); *G01R 1/18* (2013.01); *G01R 31/2891* (2013.01); *G06T 7/33* (2017.01); *G06T 11/00* (2013.01); *H04N 5/272* (2013.01); *G06T 2210/62* (2013.01)

(58) Field of Classification Search
CPC ... G01R 1/06772; G01R 1/18; G01R 31/2891
See application file for complete search history.

(56) References Cited

U.S. PATENT DOCUMENTS 5,172,049 A * 12/1992 Kiyokawa .......... G01R 31/2893
219/209
5,266,889 A * 11/1993 Harwood ................ H01L 21/68
324/750.16

(Continued)

*Primary Examiner* — Paresh Patel
(74) *Attorney, Agent, or Firm* — Li & Cai Intellectual Property Office

(57) ABSTRACT

A probe system and a machine apparatus thereof are provided. The machine apparatus can be configured for optionally carrying at least one probe assembly. The machine apparatus includes a temperature control carrier module, a machine frame structure and a temperature shielding structure. The temperature control carrier module can be configured for carrying at least one predetermined object. The machine frame structure can be configured for partially covering the temperature control carrier module, and the machine frame structure has a frame opening for exposing the temperature control carrier module. The temperature shielding structure can be disposed on the machine frame structure for partially covering the frame opening, and the temperature shielding structure has a detection opening for exposing the at least one predetermined object. The temperature shielding structure has a gas guiding channel formed thereinside for allowing a predetermined gas in the gas guiding channel.

17 Claims, 16 Drawing Sheets

(51) Int. Cl.
*G06T 11/00* (2006.01)
*H04N 5/272* (2006.01)

(56) References Cited

U.S. PATENT DOCUMENTS

| | | | | |
|---|---|---|---|---|
| 6,194,907 B1* | 2/2001 | Kanao | ................ | G01R 31/2886 |
| | | | | 324/750.08 |
| 9,784,763 B1* | 10/2017 | Teich | ................ | G01R 1/06711 |
| 2010/0289511 A1* | 11/2010 | Kiesewetter | ....... | G01R 31/2891 |
| | | | | 324/750.03 |

\* cited by examiner

PROBE SYSTEM AND MACHINE APPARATUS THEREOF

CROSS-REFERENCE TO RELATED PATENT APPLICATION

This application claims the benefit of priority to the U.S. Provisional Patent Application Ser. No. 63/234,677 filed on Aug. 18, 2021, which application is incorporated herein by reference in its entirety.

Some references, which may include patents, patent applications and various publications, can be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe system and a machine apparatus thereof, and more particularly to a probe system using a temperature shielding structure and a machine apparatus thereof.

BACKGROUND OF THE DISCLOSURE

In the related art, a probe system can be utilized to test the operation performance of a device under test (DUT), such as a semiconductor device and/or an integrated circuit device. However, as these devices become smaller, and their operating frequencies increase, physical distances that test signals must be transmitted become increasingly important and/or have an increasingly significant impact on test results. For millimeter wave (MMW) tests, which generally are performed at an operating frequency such as between 30 GHz and 300 GHz, or at operating frequencies such as sub-THz or THz, etc., signal path distances generally must be accounted for, and shorter signal paths generally generate more accurate test results.

Firstly, as illustrated by FIG. 1, a probe system includes a platen 1a, a thermal chuck 2a and two probe assemblies 3a. The thermal chuck 2a is configured below the platen 1a, and the thermal chuck 2a has a support surface configured to support a substrate (such as a wafer) for carrying the DUT. The two probe assemblies 3a are operatively mounted on the platen 1a, and each of the probe assemblies 3a includes a frequency extender 31a, a waveguide 32a and a probe head 33a having a probe tip (such as an RF probe head 33a used to test the DUT on a wafer in a temperature range from −60° C. to 300° C.). In addition, the frequency extender 31a must be within a very limited temperature range to provide good measurement accuracy for the probe system, the waveguide 32a is configured to transmit electric signals between the probe head 33a and the frequency extender 31a, and the probe head 33a can be electrically interconnected and/or mechanically interconnected with the frequency extender 31a. In addition, at least a portion of the probe assembly 3a can extend through an opening of the platen 1a so as to facilitate the contact between the probe tip and the DUT. However, it is known that if the signal path distances between the probe head 33a, the waveguide 32a and the frequency extender 31a are getting longer, the signal loss will be higher and the measurement performance will be lower as the frequency is increased.

In order to reduce or minimize the signal loss between the probe and the frequency extender 31a, the length of the waveguide 32a as shown in FIG. 1 needs to be as short as possible (i.e., using a short waveguide 32b as shown in FIG. 2), and it is even an ideal solution to directly configure the probe head 33a on the frequency extender 31a without using the waveguide 32a. However, as shown in FIG. 2, when the probe head 33a is getting closer to the frequency extender 31a by shortening the length of the waveguide 32a (i.e., using the short waveguide 32b), a horizontal distance between the probe head 33a and the frequency extender 31a will be decreased, so that the frequency extender 31a will get closer to thermal chunk in a horizontal direction during the operation of the probe assembly 3a. Therefore, when the probe tip of the probe head 33a is downwardly moved for contacting and measuring the DUT on the wafer that is carried by thermal chuck 2a, the frequency extender 31a will move down with the probe head 33a to approach thermal chuck 2a in a vertical direction, so that the frequency extender 31a will be affected easily by heating or cooling of the thermal chuck 2a.

In order to solve the above problem, as shown in FIG. 3, using a small thermal chuck 2b to reduce the heat and/or cold impact from the above-mentioned thermal chuck 2a to the frequency extender 31a is a possible solution. More particularly, when the small thermal chuck 2b is applied to the probe system, the frequency extender 31a can be configured to outwardly offset from an outer periphery of the small thermal chuck 2b in the horizontal direction, so that the frequency extender 31a can be configured to keep away from the small thermal chuck 2b (that is to say, the frequency extender 31a does not overlap the small thermal chuck 2b in the vertical direction). Therefore, the frequency extender 31a will not be affected easily by heating or cooling of the small thermal chuck 2b, and the frequency extender 31a can be configured to provide good measurement accuracy for the probe system.

However, in some millimeter wave measurements, a large thermal chuck is necessary for carrying a large wafer such as 150 mm, 200 mm or 300 mm. The size of the large thermal chuck is greater than that of the above-mentioned small thermal chuck 2b in the horizontal direction, so that the frequency extender 31a and the large thermal chuck overlap with each other in the vertical direction. Therefore, when the probe tip of the probe head 33a is downwardly moved for contacting and measuring the DUT on the large wafer that is carried by the large thermal chuck, the frequency extender 31a will move down with the probe head 33a to approach the large thermal chuck in the vertical direction, so that the frequency extender 31a will be affected easily by heating or cooling of the thermal chuck 2a.

In order to solve the above problem, as shown in FIG. 4, using a long waveguide 32c to reduce the heat impact from the above-mentioned large thermal chuck 2c to the frequency extender 31a is a possible solution. However, when the signal path distance between the probe head 33a and the frequency extender 31a is increased due to the long waveguide 32c, the signal loss between the probe head 33a and the frequency extender 31a will be increased, so that the probe system using the long waveguide 32c will be less accurate than the probe system using the short waveguide 32b.

SUMMARY OF THE DISCLOSURE

In order to solve the above-mentioned problems, the present disclosure needs to propose a probe system that can not only reduce or minimize a temperature impact (such as a heat impact or a cold impact) to a frequency extender from a substrate chuck (i.e., the effect of the temperature generated by the substrate chuck on the frequency extender), but can also maintain the measurement accuracy at operating frequencies such as a millimeter wave (from 30 GHz to 300 GHz), sub-THz or THz, etc.

In order to solve the above-mentioned problems, one of the technical aspects adopted by the present disclosure is to provide a probe system, which includes a temperature control carrier module, a machine frame structure and a temperature shielding structure. The temperature control carrier module is configured for carrying at least one predetermined object. The machine frame structure is configured for partially covering the temperature control carrier module, and the machine frame structure has a frame opening for exposing the temperature control carrier module. The temperature shielding structure is disposed on the machine frame structure for partially covering the frame opening, and the temperature shielding structure has a detection opening for exposing the at least one predetermined object. When at least one probe assembly is optionally and detachably disposed above the temperature control carrier module, the at least one probe assembly is configured to optionally contact the at least one predetermined object through the detection opening. The at least one probe assembly includes a frequency extender and a probe structure for cooperating with the frequency extender. All or a part of a perpendicular projection of the frequency extender is on the temperature shielding structure, and all or a part of a perpendicular projection of the temperature shielding structure is on the temperature control carrier module. The temperature shielding structure has a gas guiding channel formed thereinside for allowing a predetermined gas in the gas guiding channel.

In the probe system provided by one of the technical aspects of the present disclosure, the at least one probe assembly can be optionally and detachably disposed above the temperature control carrier module, and the at least one probe assembly can be configured to optionally contact the at least one predetermined object (such as a device under test) through the detection opening, so that the probe system provided by the present disclosure can provide the user with different customized requirements. In addition, all or a part of the perpendicular projection of the frequency extender can be on (or can be projected onto) the temperature shielding structure, and all or a part of the perpendicular projection of the temperature shielding structure can be on (or can be projected onto) the temperature control carrier module, so that the temperature shielding structure can be configured at any position between the frequency extender and the temperature control carrier module in the vertical direction. Moreover, the gas guiding channel formed inside the temperature shielding structure can be configured for allowing the predetermined gas to be accommodated in the gas guiding channel, so that when the predetermined gas is allowed to flow in the gas guiding channel, the temperature of the temperature shielding structure can be adjusted by flowing of the predetermined gas in the gas guiding channel.

Therefore, the present disclosure can provide the temperature shielding structure (such as including a cold and heat shielding plate) that is configured between the frequency extender and the temperature control carrier module (such as including a substrate chuck for providing a predetermined temperature to a wafer) in the vertical direction, and the cold and heat shielding plate can provide a hollow structure having a gas guiding channel formed thereinside for allowing a predetermined gas (such as air or any other gases) to flow in the gas guiding channel (such as generating airflows or gasflows in the gas guiding channel) so as to take away heat or cold radiation radiated from the substrate chuck to the cold and heat shielding plate by flowing of the predetermined gas. Hence, the cold and heat shielding plate can be configured as a temperature insulator (or a temperature barrier for blocking heat radiation or cold radiation) between the frequency extender and the substrate chuck in the vertical direction so as to reduce or minimize the temperature impact from the substrate chuck to the frequency extender, and maintain the measurement accuracy of the probe structure at operating frequencies such as a millimeter wave, sub-THz or THz, etc. In other words, when the predetermined gas is allowed to flow in the gas guiding channel of the cold and heat shielding plate, the cold and heat shielding plate can be configured as the temperature insulator or the temperature barrier between the frequency extender and the substrate chuck in the vertical direction so as to reduce or minimize the temperature impact from the substrate chuck to the frequency extender, and maintain the measurement accuracy of the probe structure at operating frequencies such as a millimeter wave, sub-THz or THz, etc.

It should be noted that, even if a distance between the probe structure (such as including a probe head and a waveguide) and the frequency extender is decreased or minimized by shortening the waveguide (or the waveguide can be omitted so as to directly mount the probe head on the frequency extender), the temperature impact from the substrate chuck to the frequency extender can still be decreased or minimized due to the cold and heat shielding plate between the frequency extender and the substrate chuck in the vertical direction, thereby maintaining the measurement accuracy of the probe structure at operating frequencies such as a millimeter wave, sub-THz or THz, etc.

It should be noted that, even if the frequency extender is configured to be very close to or contact the cold and heat shielding plate in the vertical direction, the temperature impact from the substrate chuck to the frequency extender can still be decreased or minimized due to the cold and heat shielding plate between the frequency extender and the substrate chuck in the vertical direction, thereby maintaining the measurement accuracy of the probe structure at operating frequencies such as a millimeter wave, sub-THz or THz, etc.

In order to solve the above-mentioned problems, another one of the technical aspects adopted by the present disclosure is to provide a machine apparatus that is configured for optionally carrying at least one probe assembly. The machine apparatus includes a temperature control carrier module, a machine frame structure and a temperature shielding structure. The temperature control carrier module is configured for carrying at least one predetermined object. The machine frame structure is configured for partially covering the temperature control carrier module, and the machine frame structure has a frame opening for exposing the temperature control carrier module. The temperature shielding structure is disposed on the machine frame structure for partially covering the frame opening, and the temperature shielding structure has a detection opening for exposing the at least one predetermined object. All or a part of a perpendicular projection of the temperature shielding structure is on the temperature control carrier module. The temperature shielding structure has a gas guiding channel formed thereinside for allowing a predetermined gas in the gas guiding channel.

In the machine apparatus provided by another one of the technical aspects of the present disclosure, the machine apparatus can be configured for optionally carrying at least one probe assembly, so that the machine apparatus provided by the present disclosure can provide the user with different customized requirements. In addition, all or a part of the perpendicular projection of the temperature shielding structure can be on (or can be projected onto) the temperature control carrier module, so that when the machine apparatus is configured for carrying the at least one probe assembly (such as including a frequency extender), the temperature shielding structure can be configured at any position between the frequency extender and the temperature control carrier module in the vertical direction. Moreover, the gas guiding channel formed inside the temperature shielding structure can be configured for allowing the predetermined gas to be accommodated in the gas guiding channel, so that when the predetermined gas is allowed to flow in the gas guiding channel, the temperature of the temperature shielding structure can be adjusted by flowing of the predetermined gas in the gas guiding channel.

Therefore, the present disclosure can provide the temperature shielding structure (such as including a cold and heat shielding plate) that is configured between the frequency extender and the temperature control carrier module (such as including a substrate chuck for providing a predetermined temperature to a wafer) in the vertical direction, and the cold and heat shielding plate can provide a hollow structure having a gas guiding channel formed thereinside for allowing a predetermined gas (such as air or any other gases) to flow in the gas guiding channel (such as generating airflows or gasflows in the gas guiding channel) so as to take away heat or cold radiation radiated from the substrate chuck to the cold and heat shielding plate by flowing of the predetermined gas. Hence, the cold and heat shielding plate can be configured as a temperature insulator (or a temperature barrier for blocking heat radiation or cold radiation) between the frequency extender and the substrate chuck in the vertical direction so as to reduce or minimize the temperature impact from the substrate chuck to the frequency extender, and maintain the measurement accuracy of the probe structure at operating frequencies such as a millimeter wave, sub-THz or THz, etc. In other words, when the predetermined gas is allowed to flow in the gas guiding channel of the cold and heat shielding plate, the cold and heat shielding plate can be configured as the temperature insulator or the temperature barrier between the frequency extender and the substrate chuck in the vertical direction so as to reduce or minimize the temperature impact from the substrate chuck to the frequency extender, and maintain the measurement accuracy of the probe structure at operating frequencies such as a millimeter wave, sub-THz or THz, etc.

It should be noted that, even if a distance between the probe structure (such as including a probe head and a waveguide) and the frequency extender is decreased or minimized by shortening the waveguide (or the waveguide can be omitted so as to directly mount the probe head on the frequency extender), the temperature impact from the substrate chuck to the frequency extender can still be decreased or minimized due to the cold and heat shielding plate between the frequency extender and the substrate chuck in the vertical direction, thereby maintaining the measurement accuracy of the probe structure at operating frequencies such as a millimeter wave, sub-THz or THz, etc.

It should be noted that, even if the frequency extender is configured to be very close to or contact the cold and heat shielding plate in the vertical direction, the temperature impact from the substrate chuck to the frequency extender can still be decreased or minimized due to the cold and heat shielding plate between the frequency extender and the substrate chuck in the vertical direction, thereby maintaining the measurement accuracy of the probe structure at operating frequencies such as a millimeter wave, sub-THz or THz, etc.

In order to solve the above-mentioned problems, yet another one of the technical aspects adopted by the present disclosure is to provide a machine apparatus that is configured for optionally carrying at least one probe assembly. The machine apparatus includes a temperature control carrier module, a machine frame structure and a temperature shielding structure. The temperature control carrier module is configured for carrying at least one predetermined object. The machine frame structure is configured for partially covering the temperature control carrier module, and the machine frame structure has a frame opening for exposing the temperature control carrier module. The temperature shielding structure is disposed on the machine frame structure for partially covering the frame opening, and the temperature shielding structure has a detection opening for exposing the at least one predetermined object. All or a part of a perpendicular projection of the temperature shielding structure is on the temperature control carrier module. The machine frame structure has at least one gas transmitting channel formed thereinside for allowing a predetermined gas in the at least one gas transmitting channel. When the predetermined gas is discharged from the at least one gas transmitting channel of the machine frame structure to generate a horizontal gas curtain, the horizontal gas curtain is configured as a horizontal gas barrier formed above the temperature shielding structure.

In the machine apparatus provided by yet another one of the technical aspects of the present disclosure, the machine apparatus can be configured for optionally carrying at least one probe assembly, so that the machine apparatus provided by the present disclosure can provide the user with different customized requirements. In addition, all or a part of the perpendicular projection of the temperature shielding structure can be on (or can be projected onto) the temperature control carrier module, so that when the machine apparatus is configured for carrying the at least one probe assembly (such as including a frequency extender), the temperature shielding structure can be configured at any position between the frequency extender and the temperature control carrier module in the vertical direction. Moreover, when the predetermined gas is discharged from the at least one gas transmitting channel of the machine frame structure to generate a horizontal gas curtain, the horizontal gas curtain can serve as a horizontal gas barrier between the temperature shielding structure and the frequency extender in the vertical direction.

Therefore, the present disclosure can provide the temperature shielding structure (such as including a cold and heat shielding plate) that is configured between the frequency extender and the temperature control carrier module (such as including a substrate chuck for providing a predetermined temperature to a wafer) in the vertical direction. In addition, the horizontal gas curtain can serve as a horizontal gas barrier between the cold and heat shielding plate and the frequency extender in the vertical direction so as to effectively block or take away heat or cold radiation radiated from the substrate chuck to the frequency extender through the horizontal gas curtain generated from the at least one gas transmitting channel of the machine frame structure. Hence, the horizontal gas curtain can be configured as a horizontal gas barrier between the cold and heat shielding plate and the frequency extender in the vertical direction so as to reduce or minimize the temperature impact from the substrate chuck to the frequency extender, and maintain the measurement accuracy of the probe structure at operating frequencies such as a millimeter wave, sub-THz or THz, etc. In other words, when the predetermined gas is discharged from the at least one gas transmitting channel of the machine frame structure to generate a horizontal gas curtain, the machine frame structure can be configured to generate the horizontal gas curtain (i.e., the horizontal gas barrier) between the cold and heat shielding plate and the frequency extender in the vertical direction so as to reduce or minimize the temperature impact from the substrate chuck to the frequency extender, and maintain the measurement accuracy of the probe structure at operating frequencies such as a millimeter wave, sub-THz or THz, etc.

It should be noted that, even if a distance between the probe structure (such as including a probe head and a waveguide) and the frequency extender is decreased or minimized by shortening the waveguide (or the waveguide can be omitted so as to directly mount the probe head on the frequency extender), the temperature impact from the substrate chuck to the frequency extender can still be decreased or minimized due to the horizontal gas curtain generated by the machine frame structure between the cold and heat shielding plate and the frequency extender in the vertical direction, thereby maintaining the measurement accuracy of the probe structure at operating frequencies such as a millimeter wave, sub-THz or THz, etc.

It should be noted that, even if the frequency extender is configured to be very close to or contact the cold and heat shielding plate in the vertical direction, the temperature impact from the substrate chuck to the frequency extender can still be decreased or minimized due to the horizontal gas curtain generated by the machine frame structure between the cold and heat shielding plate and the frequency extender in the vertical direction, thereby maintaining the measurement accuracy of the probe structure at operating frequencies such as a millimeter wave, sub-THz or THz, etc.

In one of the possible or preferred embodiments, the machine frame structure includes two top platens separate from each other, the temperature shielding structure includes a cold and heat shielding plate, and the probe structure includes a probe head having a probe tip, and a waveguide connected between the frequency extender and the probe head. The cold and heat shielding plate includes a plurality of first gas discharging outlets in fluid communication with the gas guiding channel, the first gas discharging outlets are arranged straightly along a first predetermined direction and arranged in a horizontal direction between the frequency extender and the probe head, and a part of the first gas discharging outlets faces the waveguide of the probe structure. When the predetermined gas is discharged from the first gas discharging outlets of the cold and heat shielding plate to generate a first vertical gas curtain, the first vertical gas curtain is formed in the horizontal direction between the frequency extender and the probe head, for reducing the effect of an ambient temperature of an outer space outside the machine frame structure upon an operating temperature of an inner accommodating space inside the machine frame structure, or for reducing the effect of the operating temperature of the inner accommodating space inside the machine frame structure upon the frequency extender. The cold and heat shielding plate includes an upper plate, a lower plate and a mating plate connected between the upper plate and the lower plate, and the mating plate has an inner surrounding sealing portion, an outer surrounding sealing portion and a plurality of gas channel partitioning portions.

The inner surrounding sealing portion is configured to connect between the upper plate and the lower plate and surround the detection opening, the outer surrounding sealing portion is configured to connect between the upper plate and the lower plate and surround the inner surrounding sealing portion, and the gas channel partitioning portions are configured to connect between the upper plate and the lower plate so as to form the gas guiding channel of the temperature shielding structure. A part of the gas channel partitioning portions is configured as a plurality of first gas guiding blocks that are arranged along a predetermined direction and partially connected to the outer surrounding sealing portion, a plurality of first spacing distances are each correspondingly formed between two adjacent ones of the first gas guiding blocks, and the first spacing distances are gradually increased toward a direction away from a first gas introducing inlet of the cold and heat shielding plate.

In the above-mentioned possible or preferred embodiments, the predetermined gas can be discharged from the first gas discharging outlets of the cold and heat shielding plate so as to generate a first vertical gas curtain that is formed in the horizontal direction between the frequency extender and the probe head, so that the effect of the ambient temperature of the outer space outside the machine frame structure upon the operating temperature of the inner accommodating space inside the machine frame structure can be decreased, or the effect of the operating temperature of the inner accommodating space inside the machine frame structure upon the frequency extender can be decreased. In addition, the first spacing distances provided by the first gas guiding blocks can be gradually increased toward a direction away from the first gas introducing inlet of the cold and heat shielding plate, thereby improving fluid stability or fluid uniformity when the predetermined gas is allowed to flow into the gas guide channel through the first gas introducing inlet of the cold and heat shielding plate.

In one of the possible or preferred embodiments, when another probe assembly is optionally and detachably disposed above the temperature control carrier module, the another probe assembly is configured to optionally contact the at least one predetermined object through the detection opening. The another probe assembly includes another frequency extender and another probe structure for cooperating with the another frequency extender, and all or a part of a perpendicular projection of the another frequency extender is on the temperature shielding structure. The another probe structure includes another probe head having another probe tip, and another waveguide connected between the another frequency extender and the another probe head, the another probe tip of the another probe head is configured for optionally passing the detection opening to contact the at least one predetermined object, and the another waveguide is configured for receiving a predetermined frequency band signal between the another frequency extender and the another probe head. When a part of the probe head of the probe structure passes through the detection opening, the probe tip of the probe head is arranged below the detection opening in the vertical direction so as to facilitate contacting a conductive pad of the at least one predetermined object. When a part of the another probe head of the another probe structure passes through the detection opening, the another probe tip of the another probe head is arranged below the detection opening in the vertical direction so as to facilitate contacting another conductive pad of the at least one predetermined object.

In the above-mentioned possible or preferred embodiments, the two probe assemblies can be simultaneously configured to be disposed above the temperature control carrier module. For example, when the two probe heads of the two probe structures simultaneously pass through the detection opening, the two probe tips of the two probe heads can be simultaneously arranged below the detection opening in the vertical direction so as to respectively facilitate contacting two conductive pads of the at least one predetermined object (for example, the two conductive pads can be used for input and output of the predetermined frequency band signals, respectively), and detect the at least one predetermined object.

In one of the possible or preferred embodiments, the cold and heat shielding plate includes a plurality of second gas discharging outlets in fluid communication with the gas guiding channel, the second gas discharging outlets are arranged straightly along a second predetermined direction and arranged in the horizontal direction between the another frequency extender and the another probe head, and a part of the second gas discharging outlets faces the another waveguide of the another probe structure. When the predetermined gas is discharged from the second gas discharging outlets of the cold and heat shielding plate to generate a second vertical gas curtain, the second vertical gas curtain is formed in the horizontal direction between the another frequency extender and the another probe head, for reducing the effect of the ambient temperature of the outer space outside the machine frame structure upon the operating temperature of the inner accommodating space inside the machine frame structure, or for reducing the effect of the operating temperature of the inner accommodating space inside the machine frame structure upon the another frequency extender. The cold and heat shielding plate includes a plurality of third gas discharging outlets in fluid communication with the gas guiding channel, and a plurality of fourth gas discharging outlets in fluid communication with the gas guiding channel, the third gas discharging outlets are arranged straightly along a third predetermined direction and arranged in the horizontal direction between the detection opening and one of the two top platens, and the fourth gas discharging outlets are arranged straightly along a fourth predetermined direction and arranged in the horizontal direction between the detection opening and another one of the two top platens. When the predetermined gas is discharged from the third gas discharging outlets of the cold and heat shielding plate to generate a third vertical gas curtain, the third vertical gas curtain is formed in the horizontal direction between the detection opening and one of the two top platens. When the predetermined gas is discharged from the fourth gas discharging outlets of the cold and heat shielding plate to generate a fourth vertical gas curtain, the fourth vertical gas curtain is formed in the horizontal direction between the detection opening and another one of the two top platens. When the first gas discharging outlets, the second gas discharging outlets, the third gas discharging outlets and the fourth gas discharging outlets are configured to be arranged in a surrounding shape to surround the detection opening of the cold and heat shielding plate, the first vertical gas curtain provided by the first gas discharging outlets, the second vertical gas curtain provided by the second gas discharging outlets, the third vertical gas curtain provided by the third gas discharging outlets and the fourth vertical gas curtain provided by the fourth gas discharging outlets are configured as a surrounding gas barrier for surrounding the detection opening of the cold and heat shielding plate so as to separate the inner accommodating space inside the machine frame structure and the outer space outside the machine frame structure from each other. Another part of the gas channel partitioning portions is configured as a plurality of second gas guiding blocks that are arranged along another predetermined direction and partially connected to the outer surrounding sealing portion, a plurality of second spacing distances are each correspondingly formed between two adjacent ones of the second gas guiding blocks, and the second spacing distances are gradually increased toward a direction away from a second gas introducing inlet of the cold and heat shielding plate.

In the above-mentioned possible or preferred embodiments, the predetermined gas can be discharged from the second gas discharging outlets of the cold and heat shielding plate so as to generate a second vertical gas curtain that is formed in the horizontal direction between the another frequency extender and the another probe head, so that the effect of the ambient temperature of the outer space outside the machine frame structure upon the operating temperature of the inner accommodating space inside the machine frame structure can be decreased, or the effect of the operating temperature of the inner accommodating space inside the machine frame structure upon the another frequency extender can be decreased. In addition, the second spacing distances provided by the second gas guiding blocks can be gradually increased toward a direction away from the second gas introducing inlet of the cold and heat shielding plate, thereby improving fluid stability or fluid uniformity when the predetermined gas is allowed to flow into the gas guide channel through the second gas introducing inlet of the cold and heat shielding plate.

It should be noted that when the first vertical gas curtain provided by the first gas discharging outlets, the second vertical gas curtain provided by the second gas discharging outlets, the third vertical gas curtain provided by the third gas discharging outlets and the fourth vertical gas curtain provided by the fourth gas discharging outlets can be configured as a surrounding gas barrier for surrounding the detection opening of the cold and heat shielding plate so as to separate the inner accommodating space inside the machine frame structure and the outer space outside the machine frame structure from each other, the effect of the ambient temperature of the outer space outside the machine frame structure upon the operating temperature of the inner accommodating space inside the machine frame structure can be decreased more effectively, or the effect of the operating temperature of the inner accommodating space inside the machine frame structure upon the frequency extender can be decreased more effectively. In addition, the second spacing distances provided by the second gas guiding blocks can be gradually increased toward a direction away from the second gas introducing inlet of the cold and heat shielding plate, thereby improving fluid stability or fluid uniformity when the predetermined gas is allowed to flow into the gas guide channel through the second gas introducing inlet of the cold and heat shielding plate.

In one of the possible or preferred embodiments, the temperature shielding structure includes a cold and heat shielding plate, and the cold and heat shielding plate includes an upper plate, a lower plate, and a mating plate connected between the upper plate and the lower plate. The upper plate has an upper opening, the lower plate has a lower opening, the mating plate has a mating opening formed between the upper opening and the lower opening, and the upper opening, the mating opening and the lower opening are in fluid communication with each other to form the detection opening of the cold and heat shielding plate. Both the upper opening of the upper plate and the mating opening of the mating plate are larger than the lower opening of the lower plate, so that a surrounding carrier portion of the lower plate is exposed by the upper opening of the upper plate and the mating opening of the mating plate. The cold and heat shielding plate includes a plurality of opening cover plates that can be optionally and detachably disposed thereon so as to partially cover the detection opening of the cold and heat shielding plate. When the opening cover plate is detachably disposed on the surrounding carrier portion of the lower plate, a shape and a size of the detection opening of the cold and heat shielding plate are changed by the opening cover plate.

In the above-mentioned possible or preferred embodiments, the opening cover plates of the cold and heat shielding plate can be optionally and detachably disposed on the cold and heat shielding plate so as to partially cover the detection opening of the cold and heat shielding plate, so that when the opening cover plate is detachably disposed on the surrounding carrier portion of the lower plate, a shape and a size of the detection opening of the cold and heat shielding plate can be changed by the opening cover plate according to different requirements, so that the operating temperature of the inner accommodating space inside the machine frame structure can be effectively maintained. That is to say, the shape and the size of the detection opening of the cold and heat shielding plate only need to meet a detecting space that is provided for the two probe assemblies to detect the at least one predetermined object, thereby enhancing the stability of the operating temperature of the inner accommodating space of the machine frame structure.

In one of the possible or preferred embodiments, the temperature control carrier module includes a substrate chuck disposed in an inner accommodating space of the machine frame structure, and a temperature controller configured for heating or cooling the substrate chuck, and the substrate chuck has a support surface extending to a position below the temperature shielding structure for supporting a carrier substrate that has carried the at least one predetermined object. The machine frame structure includes two top platens separate from each other, and a surrounding casing surroundingly connected to the two top platens, the frame opening is formed between the two top platens, the two top platens are arranged above the surrounding casing for partially covering the surrounding casing in a vertical direction, and the surrounding casing is arranged around the substrate chuck for surrounding the substrate chuck in the horizontal direction. The temperature shielding structure includes a cold and heat shielding plate arranged between the two top platens and on the surrounding casing, the cold and heat shielding plate has an upper surface, a lower surface opposite to the upper surface, and the detection opening connected between the upper surface and the lower surface, and the cold and heat shielding plate is configured as a temperature barrier between the frequency extender and the substrate chuck in the vertical direction. The at least one probe assembly is movable relative to the at least one predetermined object by driving an operable mechanism that is detachably disposed on the machine frame structure, the probe structure includes a probe head having a probe tip, and a waveguide connected between the frequency extender and the probe head, the probe tip of the probe head is configured for optionally passing the detection opening to contact the at least one predetermined object, and the waveguide is configured for transmitting a predetermined frequency band signal between the frequency extender and the probe head. When a part of the probe head of the probe structure passes through the detection opening, the probe tip of the probe head is arranged below the detection opening in the vertical direction so as to facilitate contacting a conductive pad of the at least one predetermined object. When heat radiation that is generated by heating the substrate chuck through the temperature controller is radiated to the cold and heat shielding plate, a temperature of the cold and heat shielding plate is decreased by flowing of the predetermined gas in the gas guiding channel.

In the above-mentioned possible or preferred embodiments, the temperature controller of the temperature control carrier module can be configured to heat or cool the substrate chuck, so that the present disclosure can use the temperature controller to heat or cool the carrier substrate so as to adjust a temperature of the at least one predetermined object that is carried by the carrier substrate. In addition, the cold and heat shielding plate can be configured as a temperature barrier between the frequency extender (or any kind of electronic device) and the substrate chuck in the vertical direction, so that even if the support surface of the substrate chuck extends to the position below the temperature shielding structure, the temperature impact from the substrate chuck to the frequency extender can be decreased or minimized due to the cold and heat shielding plate between the frequency extender and the substrate chuck in the vertical direction, thereby maintaining the measurement accuracy of the probe structure at operating frequencies such as a millimeter wave, sub-THz or THz, etc. Moreover, when heat radiation that is generated by heating the substrate chuck through the temperature controller is radiated to the cold and heat shielding plate, the heat radiation that is radiated from the substrate chuck to the cold and heat shielding plate can be taken away by flowing of the predetermined gas, so that the temperature of the cold and heat shielding plate can be decreased by flowing of the predetermined gas in the gas guiding channel.

In one of the possible or preferred embodiments, the temperature shielding structure includes an upper plate and a plurality of gas discharging outlets in fluid communication with the gas guiding channel, and the gas discharging outlets are configured to pass through the upper plate. The gas discharging outlets are arranged as a predetermined surrounding shape around the detection opening of the temperature shielding structure, and some of the gas discharging outlets are arranged in a horizontal direction between the frequency extender and a probe head of the probe structure.

In the above-mentioned possible or preferred embodiments, when a predetermined gas is discharged from the gas discharging outlets of the cold and heat shielding plate so as to generate a vertical gas curtain that is formed in the horizontal direction between the frequency extender and the probe head, the effect of the ambient temperature of the outer space outside the machine frame structure upon the operating temperature of the inner accommodating space inside the machine frame structure can be decreased, or the effect of the operating temperature of the inner accommodating space inside the machine frame structure upon the frequency extender can be decreased.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
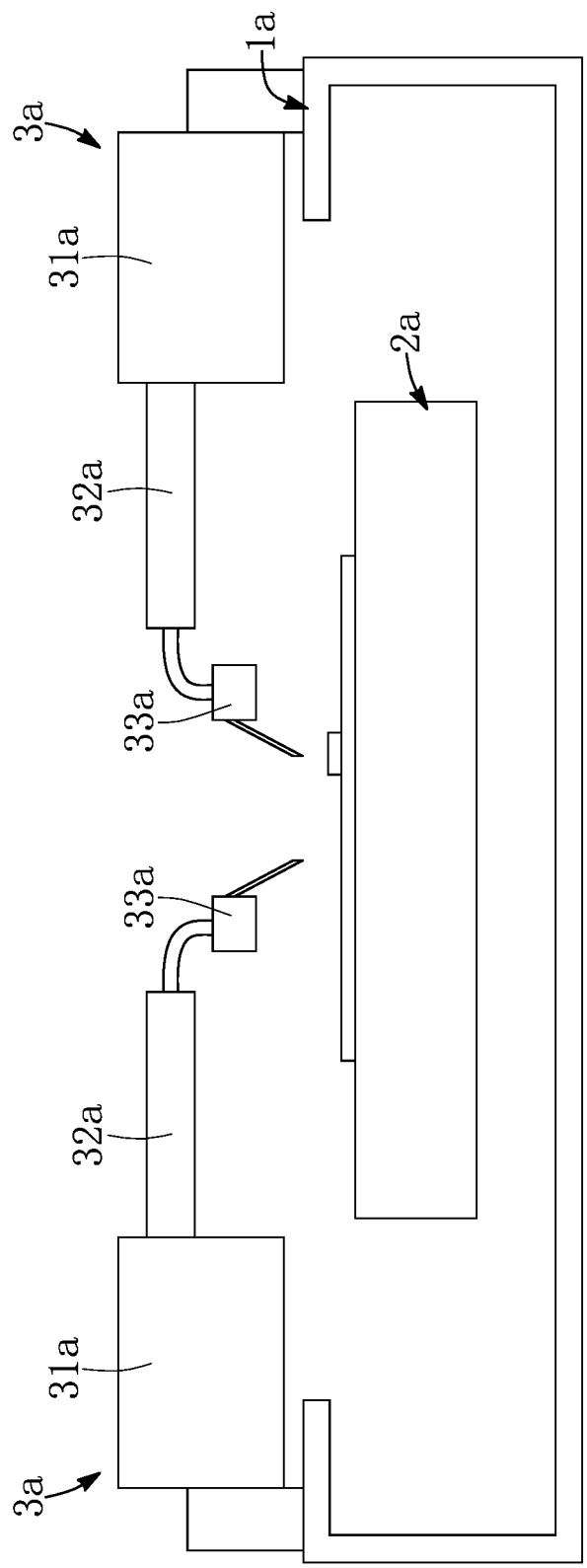
FIG. 1 is a schematic diagram of a first probe system in the related art.
Figure 2:
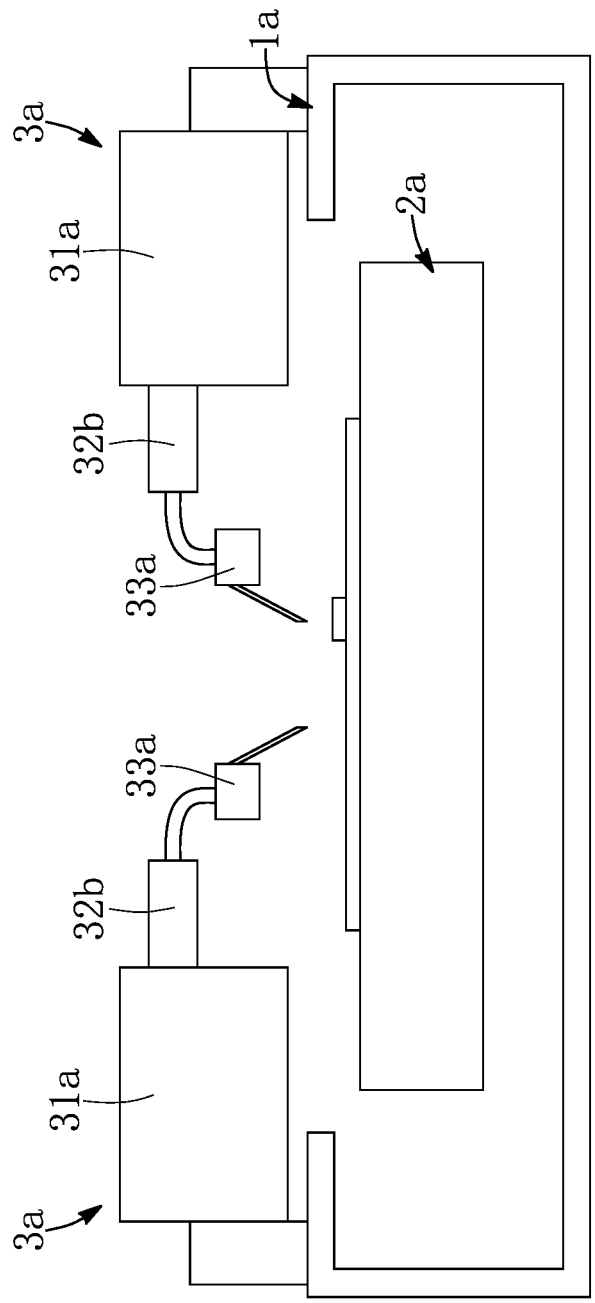
FIG. 2 is a schematic diagram of a second probe system in the related art.
Figure 3:
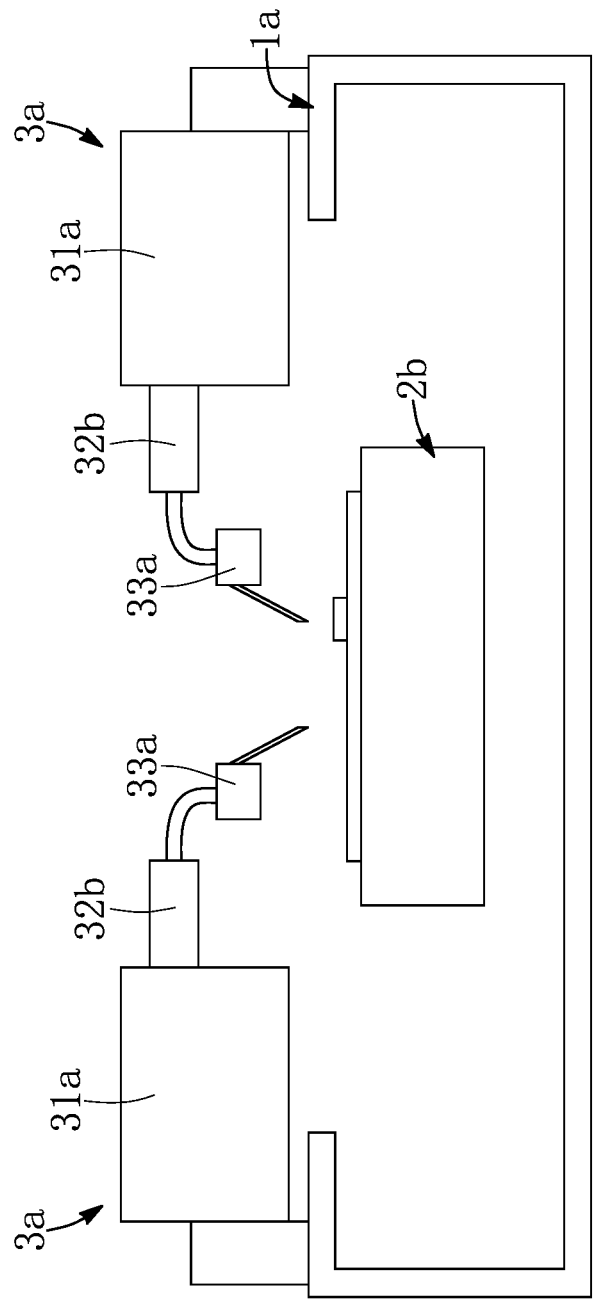
FIG. 3 is a schematic diagram of a third probe system in the related art.
Figure 4:
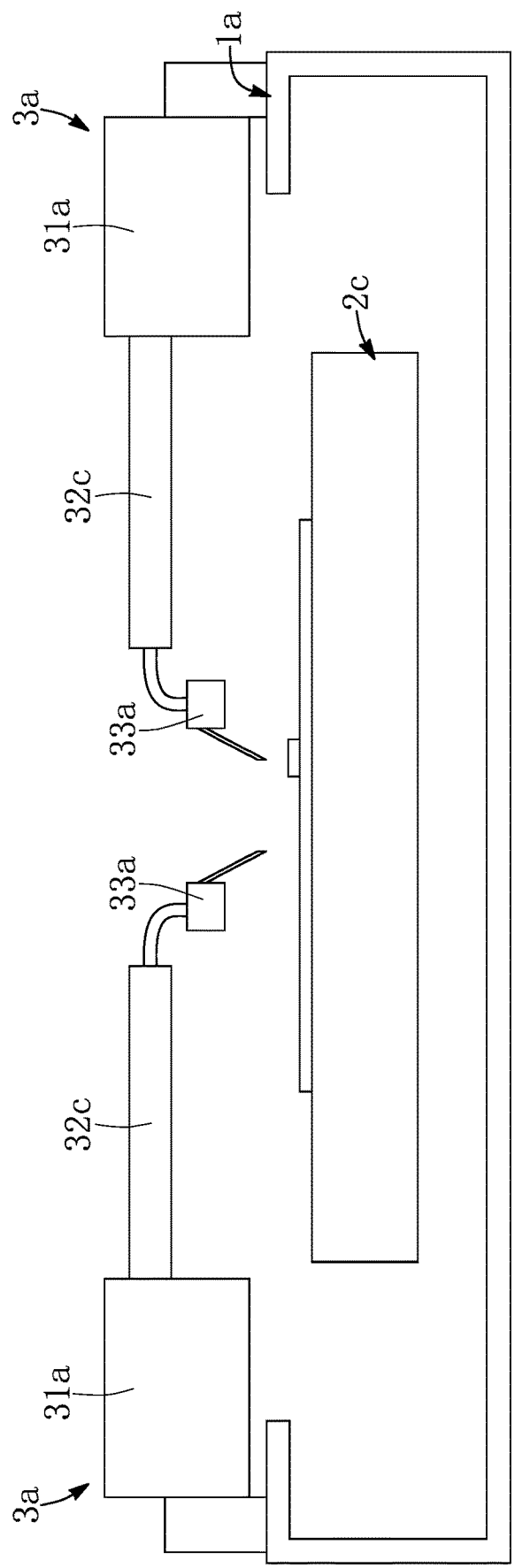
FIG. 4 is a schematic diagram of a fourth probe system in the related art.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 5 to FIG. 13, a first embodiment of the present disclosure provides a probe system S, which includes a temperature control carrier module 1, a machine frame structure 2 and a temperature shielding structure 3.

Figure 5:
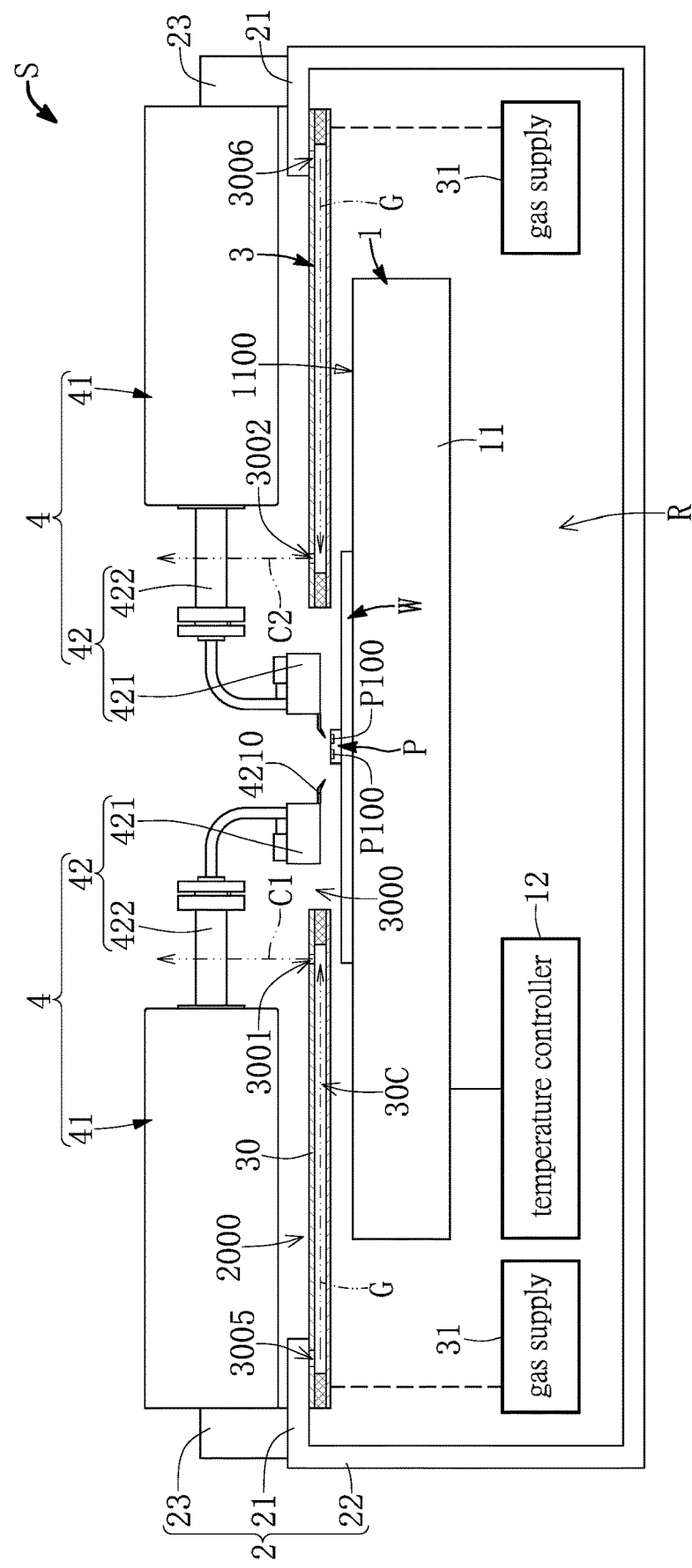
FIG. 5 is a schematic diagram of a probe system according to a first embodiment of the present invention.
Figure 6:
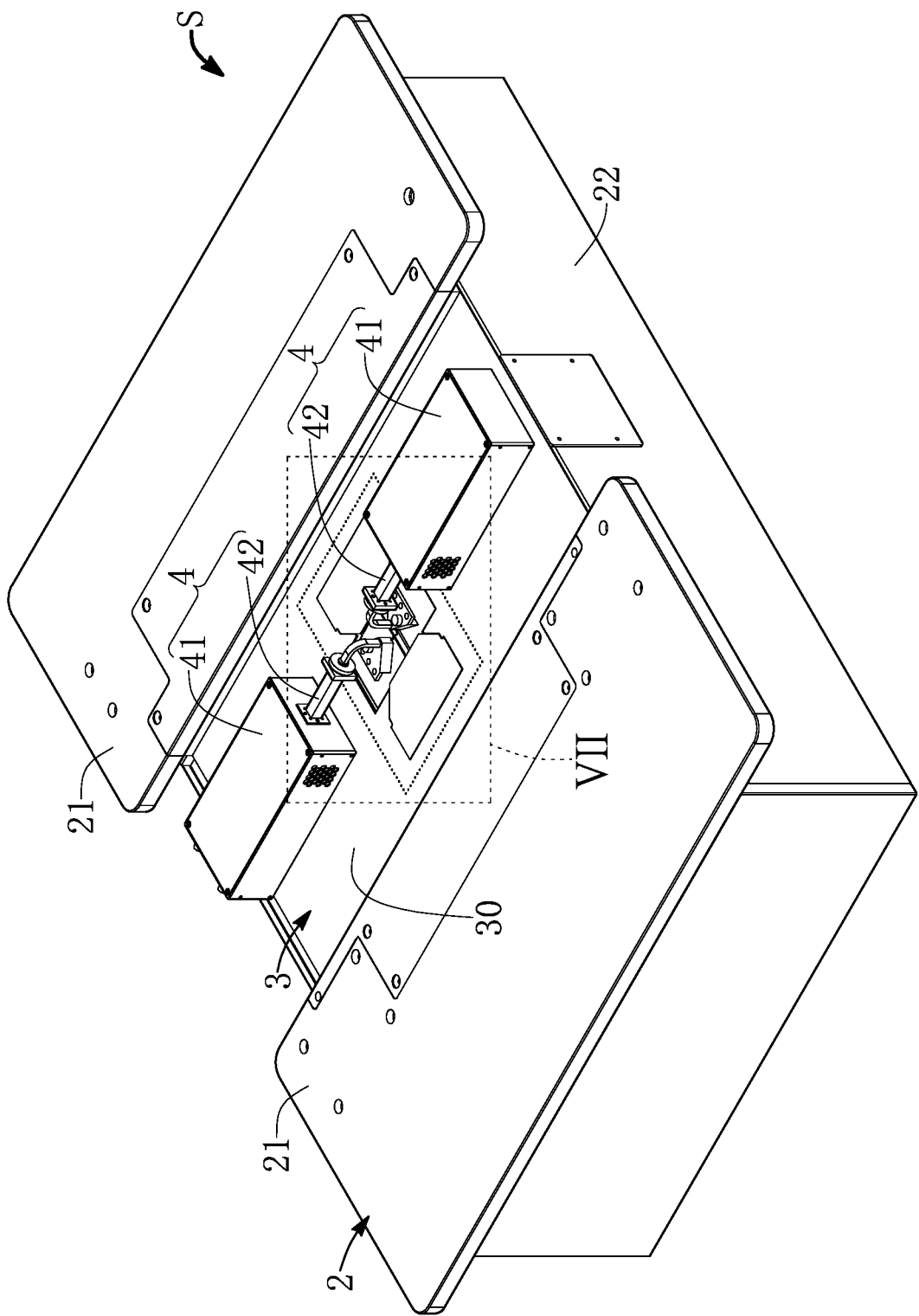
FIG. 6 is a schematic perspective view of the probe system according to the first embodiment of the present invention.

More particularly, referring to FIG. 5 and FIG. 6, the temperature control carrier module 1 can be configured for carrying at least one predetermined object P (such as a semiconductor device and/or an integrated circuit device). For example, the temperature control carrier module 1 includes a substrate chuck 11 (or a substrate holder) and a temperature controller 12 (or a temperature regulator), the substrate chuck 11 can be disposed in an inner accommodating space R of the machine frame structure 2, and the substrate chuck 11 has a support surface 1100 extending to a position below the temperature shielding structure 3 for supporting a carrier substrate W (such as a wafer or any other carrier body) that has carried the at least one predetermined object P (or a plurality of predetermined objects P). Furthermore, the temperature controller 12 can be configured for heating or cooling the substrate chuck 11 according to different requirements. Therefore, the temperature controller 12 of the temperature control carrier module 1 can be configured to heat or cool the substrate chuck 11, so that the present disclosure can use the temperature controller 12 to heat or cool the carrier substrate W so as to adjust a temperature of the at least one predetermined object P that is carried by the carrier substrate W. However, the aforementioned details are disclosed for exemplary purposes only, and are not meant to limit the scope of the present disclosure.

Figure 7:
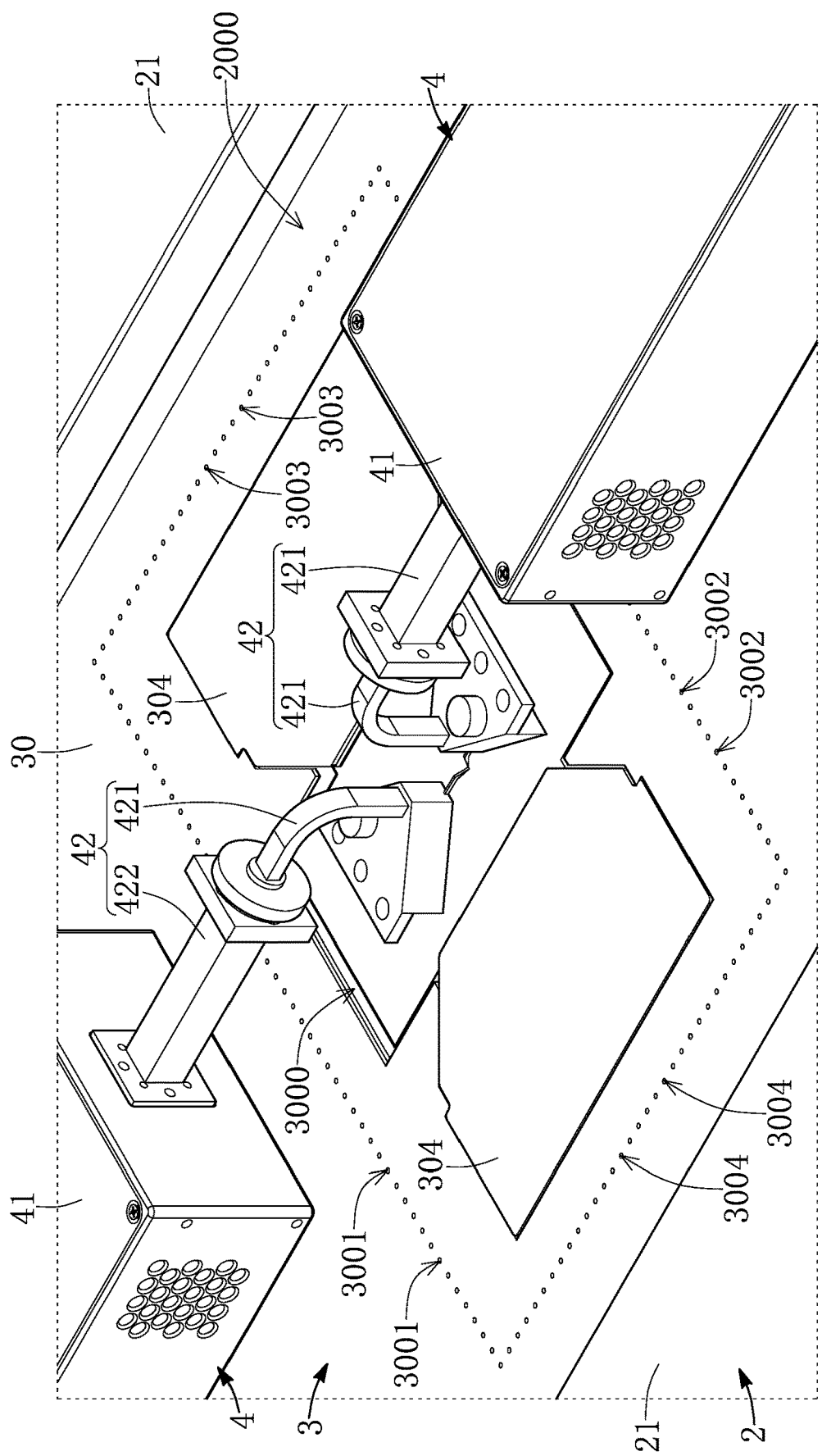
FIG. 7 is a schematic enlarged view of part VII of FIG. 6.
Figure 8:
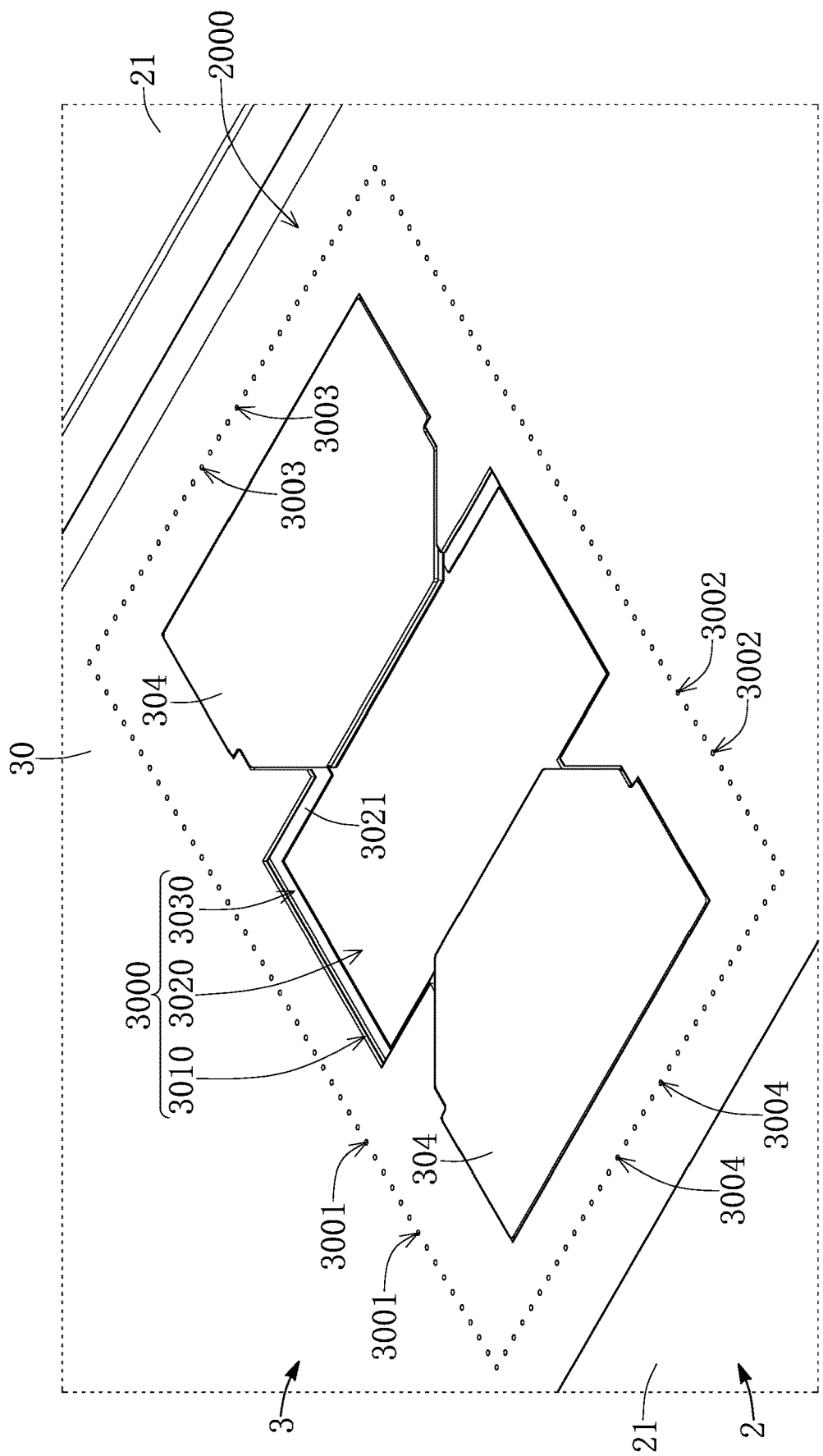
FIG. 8 is a schematic enlarged view of the probe system without two probe assemblies as shown in FIG. 7.
Figure 9:
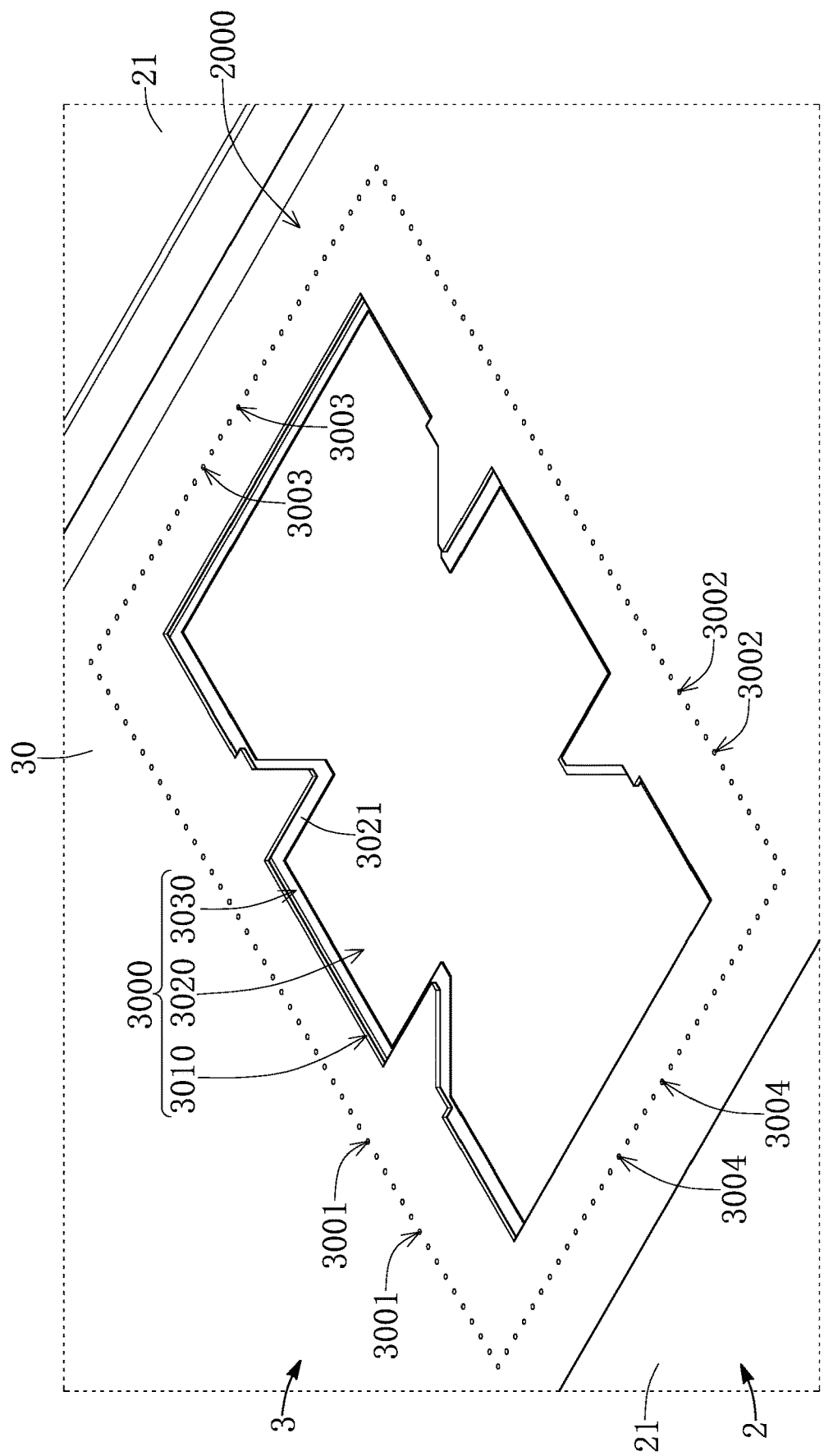
FIG. 9 is a schematic enlarged view of the probe system without two opening cover plates as shown in FIG. 8.
Figure 10:
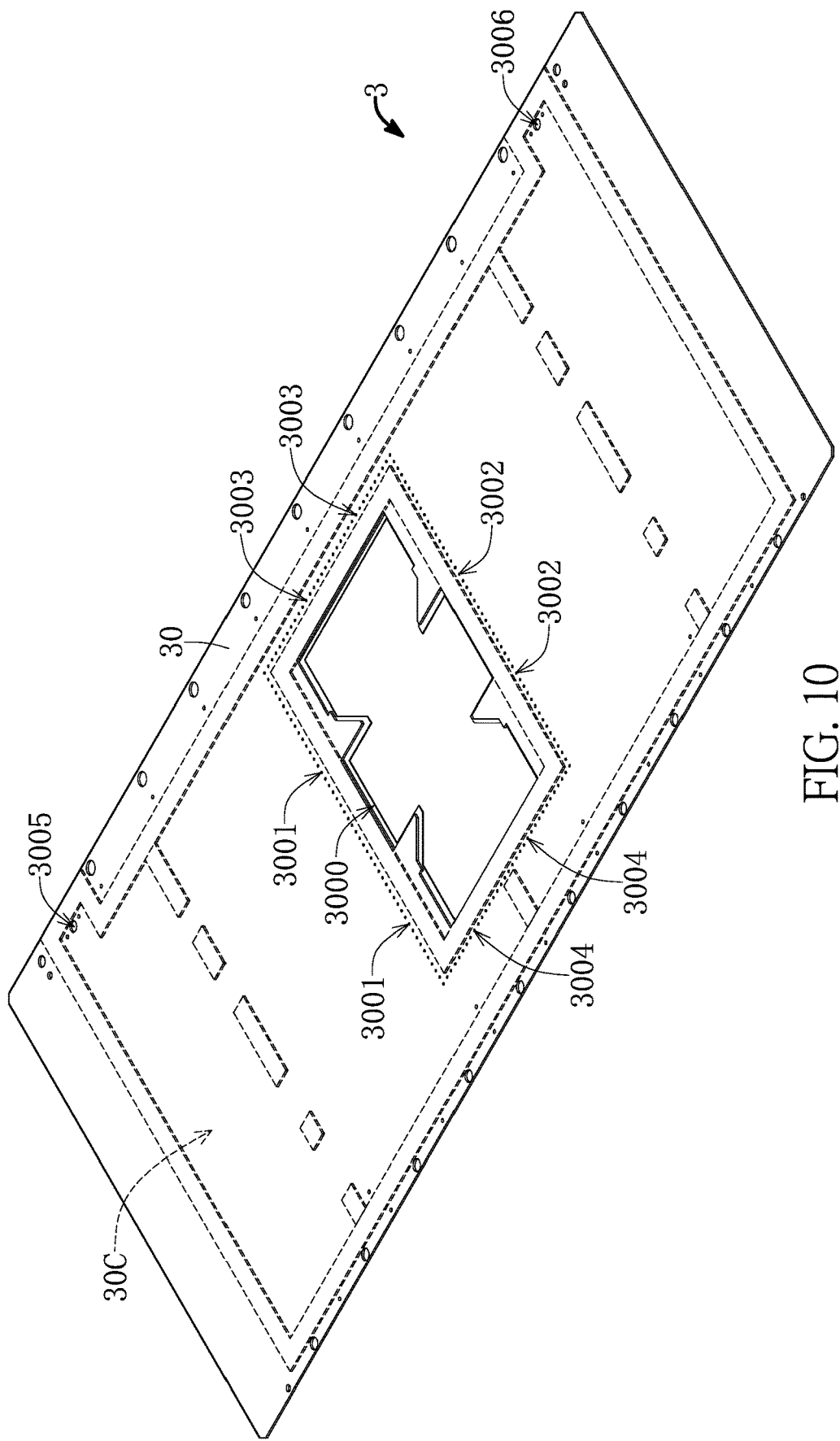
FIG. 10 is a schematic assembled view of a temperature shielding structure of the probe system according to the first embodiment of the present invention.

More particularly, referring to FIG. 5, FIG. 6 and FIG. 7, the machine frame structure 2 can be configured for partially covering the temperature control carrier module 1, and the machine frame structure 2 has a frame opening 2000 for exposing the temperature control carrier module 1. For example, the machine frame structure 2 includes two top platens 21 (or two top platforms) separate from each other, and a surrounding casing 22 surroundingly connected to the two top platens 21, and the frame opening 2000 is formed between the two top platens 21 (that is to say, the frame opening 2000 can be a separate space that is formed by separating the two top platforms 21 from each other). Furthermore, the two top platens 21 are arranged above the surrounding casing 22 for partially covering the surrounding casing 22 in a vertical direction, and the surrounding casing 22 is arranged around the substrate chuck 11 for surrounding the substrate chuck 11 in the horizontal direction (that is to say, the substrate chuck 11 is surrounded by the machine frame structure 2, and only the frame opening 2000 of the machine frame structure 2 can be used to expose the temperature control carrier module 1). However, the aforementioned details are disclosed for exemplary purposes only, and are not meant to limit the scope of the present disclosure.

More particularly, referring to FIG. 5, FIG. 6 and FIG. 7, the temperature shielding structure 3 can be disposed on the machine frame structure 2 for partially covering the frame opening 2000, and the temperature shielding structure 3 has a detection opening 3000 for exposing the at least one predetermined object P. Furthermore, the temperature shielding structure 3 has a gas guiding channel 30C formed thereinside for allowing a predetermined gas G (such as air or any other gases provided by a gas supply 31 or an air supply configured inside or outside the inner accommodating space R of the substrate chuck 11) in the gas guiding channel 30C. For example, the temperature shielding structure 3 includes a cold and heat shielding plate 30 arranged between the two top platens 21 and on the surrounding casing 22, in which, the cold and heat shielding plate 30 has an upper surface, a lower surface opposite to the upper surface, and the detection opening 3000 connected between the upper surface and the lower surface, and the cold and heat shielding plate 30 can be configured as a temperature barrier between a frequency extender 41 (or any kind of electronic device) and the substrate chuck 11 in the vertical direction. It should be noted that the gas guiding channel 30C formed inside the temperature shielding structure 3 can be configured for allowing the predetermined gas G to be accommodated in the gas guiding channel 30C (for example, there will be no need to use the predetermined gas G in the gas guiding channel 30C when the temperature provided by the temperature control carrier module 1 is below 100 degrees), so that when the predetermined gas G is allowed to flow in the gas guiding channel 30C, the temperature of the temperature shielding structure 3 can be adjusted (for example, reducing the temperature of the temperature shielding structure 3) by flowing of the predetermined gas G in the gas guiding channel 30C. Therefore, when heat radiation that is generated by heating the substrate chuck 11 through the temperature controller 12 is radiated to the cold and heat shielding plate 30, a temperature of the cold and heat shielding plate 30 can be decreased by flowing of the predetermined gas G in the gas guiding channel 30C. However, the aforementioned details are disclosed for exemplary purposes only, and are not meant to limit the scope of the present disclosure.

More particularly, referring to FIG. 5, FIG. 6 and FIG. 7, according to different requirements, at least one probe assembly 4 can be configured to be disposed above the temperature control carrier module 1, or two probe assemblies 4 can be simultaneously configured to be disposed above the temperature control carrier module 1. For example, when two probe assemblies 4 are optionally and detachably disposed above the temperature control carrier module 1, the two probe assemblies 4 can be configured to optionally contact the at least one predetermined object P through the detection opening 3000. Furthermore, each of the two assemblies 4 includes a frequency extender 41 and a probe structure 42 for cooperating with the frequency extender 41, and each of the two probe assemblies 4 can be movable relative to the at least one predetermined object P by driving an operable mechanism 23 (as shown in FIG. 5) that is detachably disposed on the machine frame structure 2 (that is to say, each operable mechanism 23 can be configured to adjust the distance from one of the two probe assemblies 4 to the at least one predetermined object P). Moreover, the probe structure 42 includes a probe head 421 having a probe tip 4210, and a waveguide 422 connected between the frequency extender 41 and the probe head 421. In which, the probe tip 4210 of the probe head 421 can be configured for optionally passing the detection opening 3000 to contact the at least one predetermined object P, and the waveguide 422 can be configured for transmitting or receiving a predetermined frequency band signal between the frequency extender 41 and the probe head 421. However, the aforementioned details are disclosed for exemplary purposes only, and are not meant to limit the scope of the present disclosure.

According to the above description, referring to FIG. 5, FIG. 6 and FIG. 7, when a part of the probe head 421 of each probe structure 42 passes through the detection opening 3000, the probe tip 4210 of the probe head 421 can be arranged below the detection opening 3000 in the vertical direction so as to facilitate contacting one of two conductive pads P100 (as shown in FIG. 5) of the at least one predetermined object P. Alternatively, when the two probe heads 421 of the two probe structures 42 simultaneously pass through the detection opening 3000, the two probe tips 4210 of the two probe heads 421 can be simultaneously arranged below the detection opening 3000 in the vertical direction so as to respectively facilitate contacting the two conductive pads P100 of the at least one predetermined object P (for example, the two conductive pads P100 can be used for input and output of the predetermined frequency band signals, respectively), and detect the at least one predetermined object P. Therefore, the two probe assemblies 4 can be optionally and detachably disposed above the temperature control carrier module 1, and the two probe assemblies 4 can be configured to optionally contact the at least one predetermined object P (such as a device under test) through the detection opening 3000, so that the probe system S provided by the present disclosure can provide the user with different customized requirements (that is to say, according to different requirements, the user has more choices for the usage quantity and the placement position of the probe assemblies 4 disposed above the temperature control carrier module 1). However, the aforementioned details are disclosed for exemplary purposes only, and are not meant to limit the scope of the present disclosure.

It should be noted that referring to FIG. 5, FIG. 6 and FIG. 7, all (as shown in FIG. 5) or a part of a perpendicular projection of the frequency extender 41 can be on the temperature shielding structure 3, and all or a part (as shown in FIG. 5) of a perpendicular projection of the temperature shielding structure 3 can be on the temperature control carrier module 1. Therefore, all or a part of the perpendicular projection of the frequency extender 41 can be on (or can be projected onto) the temperature shielding structure 3, and all or a part of the perpendicular projection of the temperature shielding structure 3 can be on (or can be projected onto) the temperature control carrier module 1, so that the temperature shielding structure 3 can be configured at any position between the frequency extender 41 and the temperature control carrier module 1 in the vertical direction according to different requirements.

According to the above description, as shown in FIG. 5, the cold and heat shielding plate 30 can be configured as a temperature barrier between the frequency extender 41 and the substrate chuck 11 in the vertical direction, so that even if the support surface 1100 of the substrate chuck 11 extends to the position below the temperature shielding structure 3, the temperature impact from the substrate chuck 11 to the frequency extender 41 can be decreased or minimized due to the cold and heat shielding plate 30 between the frequency extender 41 and the substrate chuck 11 in the vertical direction, thereby maintaining the measurement accuracy of the probe structure 42 at operating frequencies such as a millimeter wave, sub-THz or THz, etc. Moreover, when heat radiation that is generated by heating the substrate chuck 11 through the temperature controller 12 is radiated to the cold and heat shielding plate 30, the heat radiation that is radiated from the substrate chuck 11 to the cold and heat shielding plate 30 can be taken away by flowing of the predetermined gas G, so that the temperature of the cold and heat shielding plate 30 can be decreased by flowing of the predetermined gas G in the gas guiding channel 30C.

For example, referring to FIG. 5, FIG. 6 and FIG. 7, the cold and heat shielding plate 30 includes a plurality of first gas discharging outlets 3001 (such as exhaust vents) in fluid communication with the gas guiding channel 30C. It should be noted that the first gas discharging outlets 3001 can be arranged substantially straightly along a first predetermined direction (for example, as shown in FIG. 7, can be arranged along the direction from one top platform 21 to another top platform 21) and arranged in a horizontal direction between one of the frequency extenders 41 and one of the probe heads 421 (that is to say, the perpendicular projections of the first gas discharging outlets 3001 can be arranged in the horizontal direction between one of the frequency extenders 41 and one of the probe heads 421), and a part of the first gas discharging outlets 3001 can face the waveguide 422 of one of the probe structures 42. Therefore, when the predetermined gas G is discharged from the first gas discharging outlets 3001 of the cold and heat shielding plate 30 to generate a first vertical gas curtain C1, the first vertical gas curtain C1 can be formed in the horizontal direction between one of the frequency extenders 41 and one of the probe heads 421, for reducing the effect of an ambient temperature of an outer space outside the machine frame structure 2 upon an operating temperature (or working temperature) of the inner accommodating space R inside the machine frame structure 2, or for reducing the effect of the operating temperature of the inner accommodating space R inside the machine frame structure 2 upon one of the frequency extenders 41. In other words, the predetermined gas G can be discharged from the first gas discharging outlets 3001 of the cold and heat shielding plate 30 so as to generate a first vertical gas curtain C1 that is formed in the horizontal direction between one of the frequency extenders 41 and one of the probe heads 421, so that the effect of the ambient temperature of the outer space outside the machine frame structure 2 upon the operating temperature of the inner accommodating space R inside the machine frame structure 2 can be decreased, or the effect of the operating temperature of the inner accommodating space R inside the machine frame structure 2 upon one of the frequency extenders 41 can be decreased. However, the aforementioned details are disclosed for exemplary purposes only, and are not meant to limit the scope of the present disclosure.

According to the above description, referring to FIG. 5, FIG. 6 and FIG. 7, the cold and heat shielding plate 30 includes a plurality of second gas discharging outlets 3002 (such as exhaust vents) in fluid communication with the gas guiding channel 30C, the second gas discharging outlets 3002 are arranged substantially straightly along a second predetermined direction (for example, as shown in FIG. 7, can be arranged along the direction from one top platform 21 to another top platform 21) and arranged in the horizontal direction between another one of the frequency extenders 41 and another one of the probe heads 421 (that is to say, the perpendicular projections of the second gas discharging outlets 3002 can be arranged in the horizontal direction between another one of the frequency extenders 41 and another one of the probe heads 421), and a part of the second gas discharging outlets 3002 can face the waveguide 422 of another one of the probe structures 42. Therefore, when the predetermined gas G is discharged from the second gas discharging outlets 3002 of the cold and heat shielding plate 30 to generate a second vertical gas curtain C2, the second vertical gas curtain C2 can be formed in the horizontal direction between another one of the frequency extenders 41 and another one of the probe heads 421, for reducing the effect of the ambient temperature of the outer space outside the machine frame structure 2 upon the operating temperature of the inner accommodating space R inside the machine frame structure 2, or for reducing the effect of the operating temperature of the inner accommodating space R inside the machine frame structure 2 upon the another frequency extender 41. However, the aforementioned details are disclosed for exemplary purposes only, and are not meant to limit the scope of the present disclosure.

Figure 11:
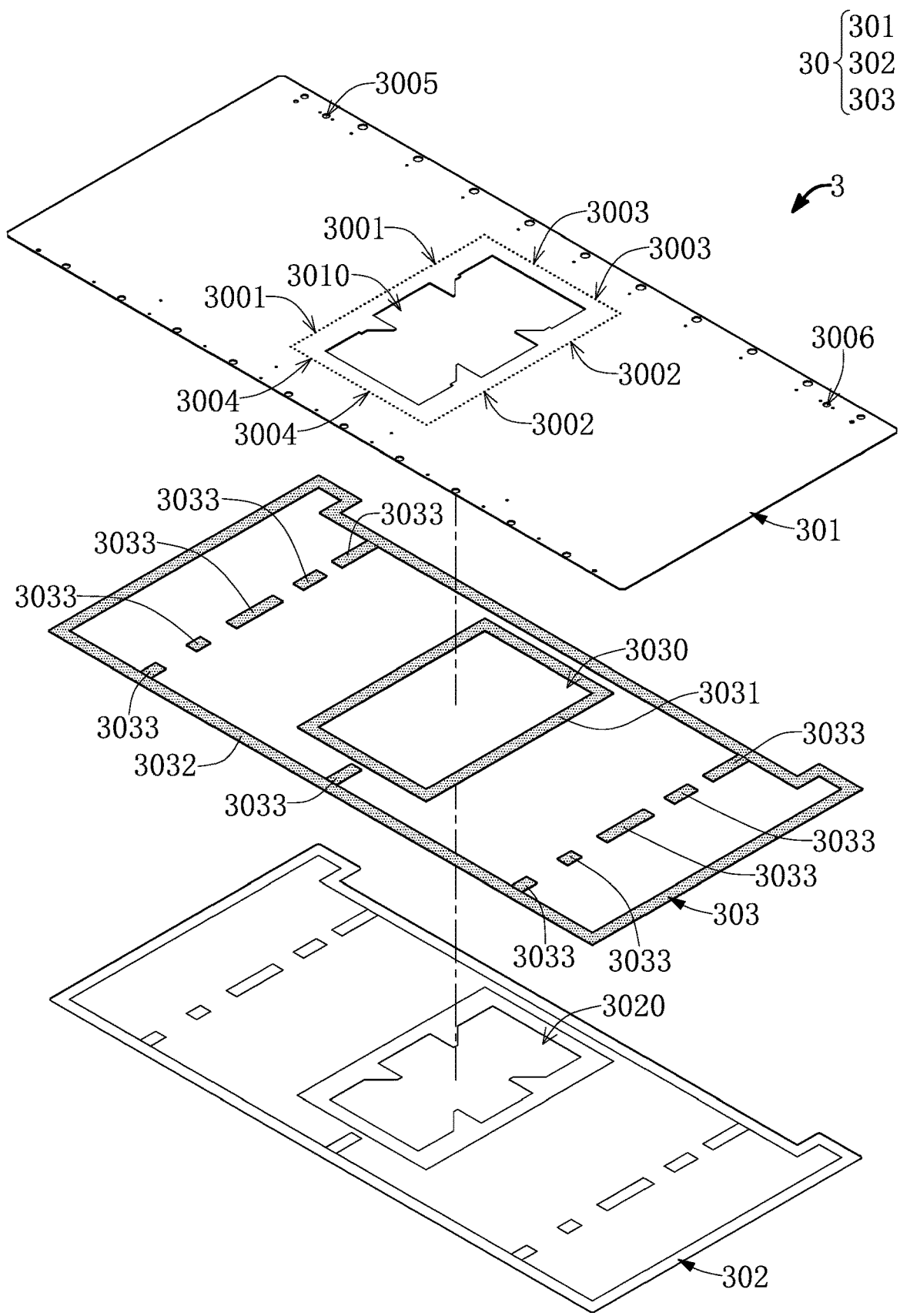
FIG. 11 is a schematic exploded view of the temperature shielding structure of the probe system according to the first embodiment of the present invention.
Figure 12:
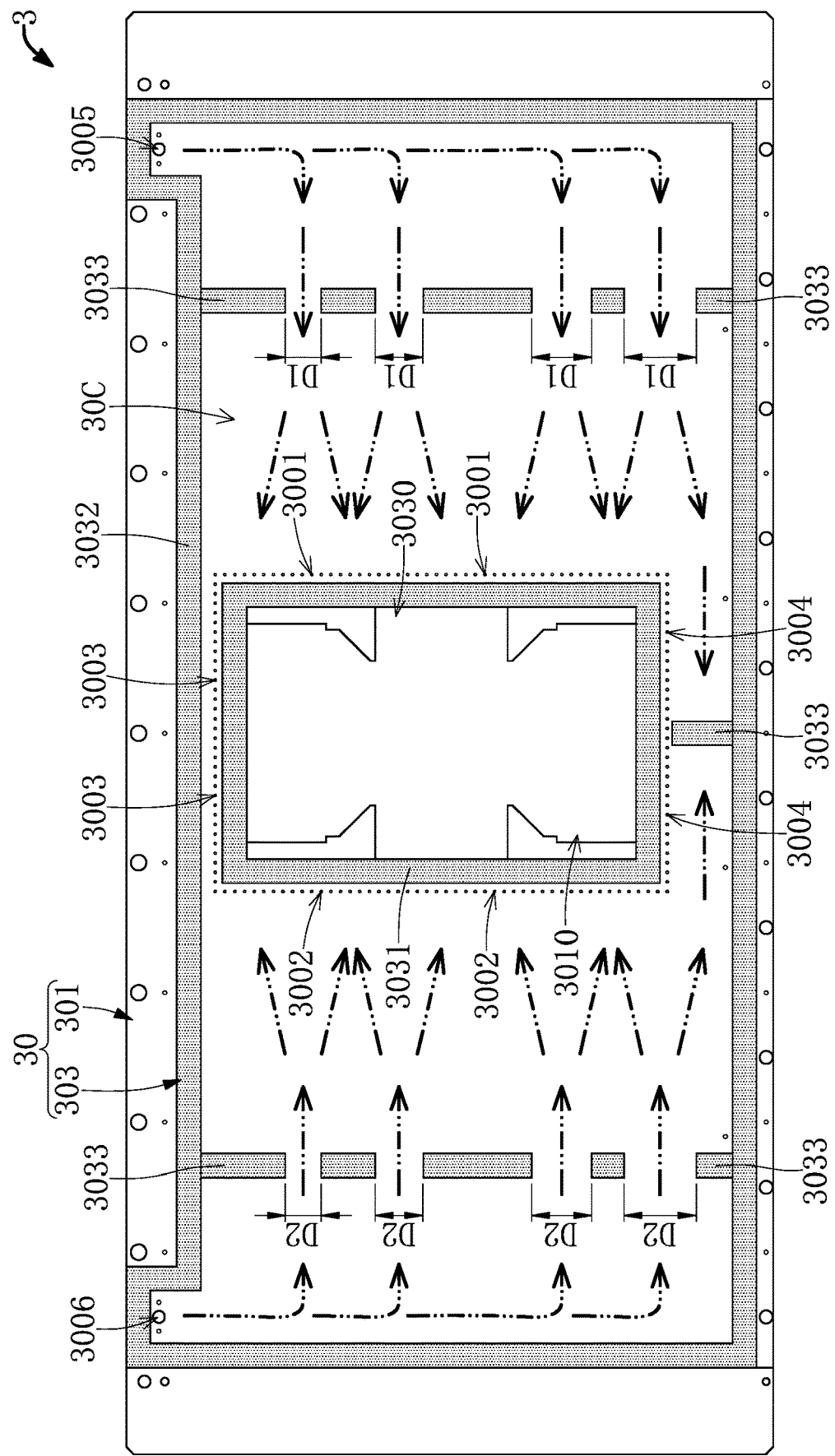
FIG. 12 is a schematic bottom view of the temperature shielding structure of the probe system without a lower plate as shown in FIG. 11 according to the first embodiment of the present invention.

For example, referring to FIG. 5, FIG. 10, FIG. 11 and FIG. 12, the cold and heat shielding plate 30 includes an upper plate 301, a lower plate 302 and a mating plate 303 connected between the upper plate 301 and the lower plate 302, and the mating plate 303 has an inner surrounding sealing portion 3031, an outer surrounding sealing portion 3032 and a plurality of gas channel partitioning portions 3033, in which, the inner surrounding sealing portion 3031 can be configured to connect between the upper plate 301 and the lower plate 302 and surround the detection opening 3000, the outer surrounding sealing portion 3032 can be configured to connect between the upper plate 301 and the lower plate 302 and surround the inner surrounding sealing portion 3031, and the gas channel partitioning portions 3033 can be configured to connect between the upper plate 301 and the lower plate 302 so as to form the gas guiding channel 30C of the temperature shielding structure 3. It should be noted that as shown in FIG. 12, a part of the gas channel partitioning portions 3033 can be configured as a plurality of first gas guiding blocks that are arranged along a predetermined direction and partially connected to the outer surrounding sealing portion 3032, the first spacing distances D1 are each correspondingly formed between two adjacent ones of the first gas guiding blocks, and the first spacing distances D1 are gradually increased toward a direction away from a first gas introducing inlet 3005 of the cold and heat shielding plate 30, thereby improving fluid stability or fluid uniformity when the predetermined gas G provided by the gas supply 31 is allowed to flow into the gas guide channel through the first gas introducing inlet 3005 of the cold and heat shielding plate 30. Furthermore, as shown in FIG. 12, another part of the gas channel partitioning portions 3033 can be configured as a plurality of second gas guiding blocks that are arranged along another predetermined direction and partially connected to the outer surrounding sealing portion 3032, the second spacing distances D2 are each correspondingly formed between two adjacent ones of the second gas guiding blocks, and the second spacing distances D2 are gradually increased toward a direction away from a second gas introducing inlet 3006 of the cold and heat shielding plate 30, thereby improving fluid stability or fluid uniformity when the predetermined gas G provided by the gas supply 31 is allowed to flow into the gas guide channel through the second gas introducing inlet 3006 of the cold and heat shielding plate 30. However, the aforementioned details are disclosed for exemplary purposes only, and are not meant to limit the scope of the present disclosure.

It should be noted that, for example, referring to FIG. 7, FIG. 10, FIG. 12 and FIG. 13, the cold and heat shielding plate 30 includes a plurality of third gas discharging outlets 3003 (such as exhaust vents) in fluid communication with the gas guiding channel 30C, and a plurality of fourth gas discharging outlets 3004 (such as exhaust vents) in fluid communication with the gas guiding channel 30C. The third gas discharging outlets 3003 can be arranged substantially straightly along a third predetermined direction (for example, as shown in FIG. 7, can be arranged along the direction from one frequency extender 41 to another frequency extender 41) and arranged in the horizontal direction between the detection opening 3000 and one of the two top platens 21. The fourth gas discharging outlets 3004 can be arranged substantially straightly along a fourth predetermined direction (for example, as shown in FIG. 7, can be arranged along the direction from one frequency extender 41 to another frequency extender 41) and arranged in the horizontal direction between the detection opening 3000 and another one of the two top platens 21. In one of the possible aspects, when the predetermined gas G is discharged from the third gas discharging outlets 3003 of the cold and heat shielding plate 30 to generate a third vertical gas curtain C3, the third vertical gas curtain C3 can be formed in the horizontal direction between the detection opening 3000 and one of the two top platens 21. In one of the possible aspects, when the predetermined gas G is discharged from the fourth gas discharging outlets 3004 of the cold and heat shielding plate 30 to generate a fourth vertical gas curtain C4, the fourth vertical gas curtain C4 can be formed in the horizontal direction between the detection opening 3000 and another one of the two top platens 21. That is to say, the temperature shielding structure 3 can be configured to provide a plurality of gas discharging outlets (3001~3004) that is in fluid communication with the gas guiding channel 30C and passes through the upper plate 301, the gas discharging outlets (3001~3004) can be arranged in any predetermined surrounding shape (such as rectangle, square, polygon, circle, rhombus, ellipse or trapezoid) to surround the detection opening 3000 of the temperature shielding structure 3, and some of the gas discharging outlets (such as the two gas discharging outlets 3001, 3002) can be arranged in a horizontal direction between one of the frequency extenders 41 and a probe head 421 of one of the probe structures 42. However, the aforementioned details are disclosed for exemplary purposes only, and are not meant to limit the scope of the present disclosure.

Figure 13:
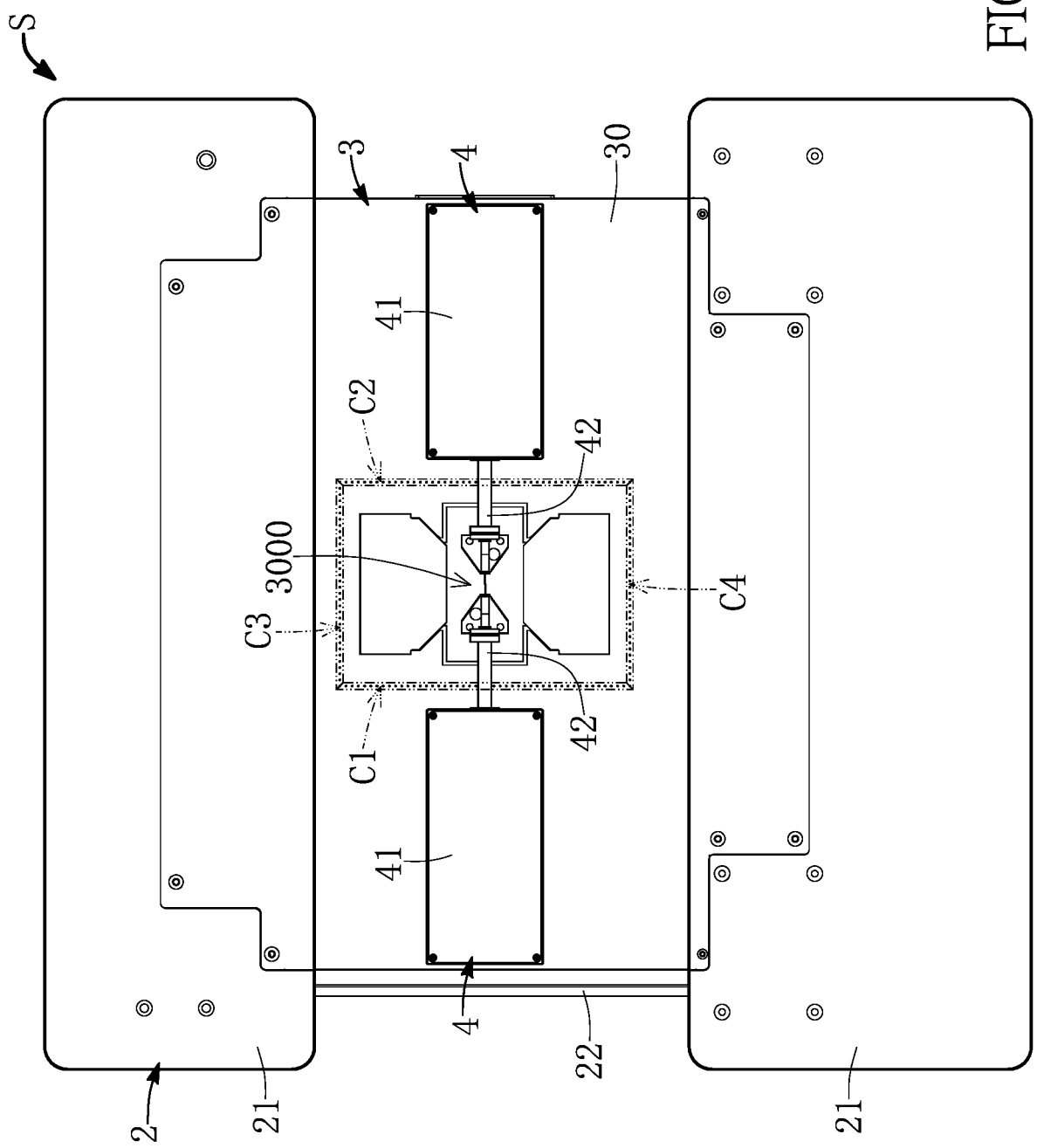
FIG. 13 is a schematic top view of the probe system according to the first embodiment of the present invention.

It should be noted that, for example, referring to FIG. 5, FIG. 7 and FIG. 13, in one of the possible aspects, when the first gas discharging outlets 3001, the second gas discharging outlets 3002, the third gas discharging outlets 3003 and the fourth gas discharging outlets 3004 can be configured to be arranged in a surrounding shape to surround the detection opening 3000 of the cold and heat shielding plate 30, the first vertical gas curtain C1 provided by the first gas discharging outlets 3001, the second vertical gas curtain C2 provided by the second gas discharging outlets 3002, the third vertical gas curtain C3 provided by the third gas discharging outlets 3003 and the fourth vertical gas curtain C4 provided by the fourth gas discharging outlets 3004 can be configured as a surrounding gas barrier for surrounding the detection opening 3000 of the cold and heat shielding plate 30 so as to separate the inner accommodating space R inside the machine frame structure 2 and the outer space outside the machine frame structure 2 from each other. Therefore, when the first vertical gas curtain C1 provided by the first gas discharging outlets 3001, the second vertical gas curtain C2 provided by the second gas discharging outlets 3002, the third vertical gas curtain C3 provided by the third gas discharging outlets 3003 and the fourth vertical gas curtain C4 provided by the fourth gas discharging outlets 3004 can be configured as a surrounding gas barrier for surrounding the detection opening 3000 of the cold and heat shielding plate 30 so as to separate the inner accommodating space R inside the machine frame structure 2 and the outer space outside the machine frame structure 2 from each other, the effect of the ambient temperature of the outer space outside the machine frame structure 2 upon the operating temperature of the inner accommodating space R inside the machine frame structure 2 can be decreased more effectively, or the effect of the operating temperature of the inner accommodating space R inside the machine frame structure 2 upon the frequency extender 41 can be decreased more effectively. However, the aforementioned details are disclosed for exemplary purposes only, and are not meant to limit the scope of the present disclosure.

It should be noted that, for example, referring to FIG. 7, FIG. 8, FIG. 9 and FIG. 11, the upper plate 301 has an upper opening 3010, the lower plate 302 has a lower opening 3020, the mating plate 303 has a mating opening 3030 formed between the upper opening 3010 and the lower opening 3020, and the upper opening 3010, the mating opening 3030 and the lower opening 3020 can be in fluid communication with each other to form the detection opening 3000 of the cold and heat shielding plate 30. Furthermore, both the upper opening 3010 of the upper plate 301 and the mating opening 3030 of the mating plate 303 are larger than the lower opening 3020 of the lower plate 302, so that a surrounding carrier portion 3021 of the lower plate 302 can be exposed by the upper opening 3010 of the upper plate 301 and the mating opening 3030 of the mating plate 303. Moreover, the cold and heat shielding plate 30 includes a plurality of opening cover plates 304 that can be optionally and detachably disposed thereon so as to partially cover the detection opening 3000 of the cold and heat shielding plate 30. Therefore, when the opening cover plate 304 is detachably disposed on the surrounding carrier portion 3021 of the lower plate 302, a shape and a size of the detection opening 3000 of the cold and heat shielding plate 30 can be changed by the opening cover plate 304. In other words, the opening cover plates 304 of the cold and heat shielding plate 30 can be optionally and detachably disposed on the cold and heat shielding plate 30 so as to partially cover the detection opening 3000 of the cold and heat shielding plate 30, so that when the opening cover plate 304 is detachably disposed on the surrounding carrier portion 3021 of the lower plate 302, a shape and a size of the detection opening 3000 of the cold and heat shielding plate 30 can be changed by the opening cover plate 304 according to different requirements, so that the operating temperature of the inner accommodating space R inside the machine frame structure 2 can be effectively maintained. That is to say, the shape and the size of the detection opening 3000 of the cold and heat shielding plate 30 only need to meet a detecting space that is provided for the two probe assemblies 4 to detect the at least one predetermined object P, thereby enhancing the stability of the operating temperature of the inner accommodating space R of the machine frame structure 2. However, the aforementioned details are disclosed for exemplary purposes only, and are not meant to limit the scope of the present disclosure.

Therefore, referring to FIG. 5, FIG. 6 and FIG. 7, the present disclosure can provide the temperature shielding structure 3 (such as including a cold and heat shielding plate 30) that is configured between the frequency extender 41 and the temperature control carrier module 1 (such as including a substrate chuck 11 for providing a predetermined temperature to a wafer) in the vertical direction, and the cold and heat shielding plate 30 can provide a hollow structure having a gas guiding channel 30C formed thereinside for allowing a predetermined gas G (such as air or any other gases) to flow in the gas guiding channel 30C (such as generating airflows or gasflows in the gas guiding channel 30C) so as to take away heat or cold radiation radiated from the substrate chuck 11 to the cold and heat shielding plate 30 by flowing of the predetermined gas G. Hence, the cold and heat shielding plate 30 can be configured as a temperature insulator (or a temperature barrier for blocking heat radiation or cold radiation) between the frequency extender 41 and the substrate chuck 11 in the vertical direction so as to reduce or minimize the temperature impact from the substrate chuck 11 to the frequency extender 41, and maintain the measurement accuracy of the probe structure 42 at operating frequencies such as a millimeter wave, sub-THz or THz, etc. In other words, when the predetermined gas G is allowed to flow in the gas guiding channel 30C of the cold and heat shielding plate 30, the cold and heat shielding plate 30 can be configured as the temperature insulator or the temperature barrier between the frequency extender 41 and the substrate chuck 11 in the vertical direction so as to reduce or minimize the temperature impact from the substrate chuck 11 to the frequency extender 41, and maintain the measurement accuracy of the probe structure 42 at operating frequencies such as a millimeter wave, sub-THz or THz, etc.

Second Embodiment

Figure 14:
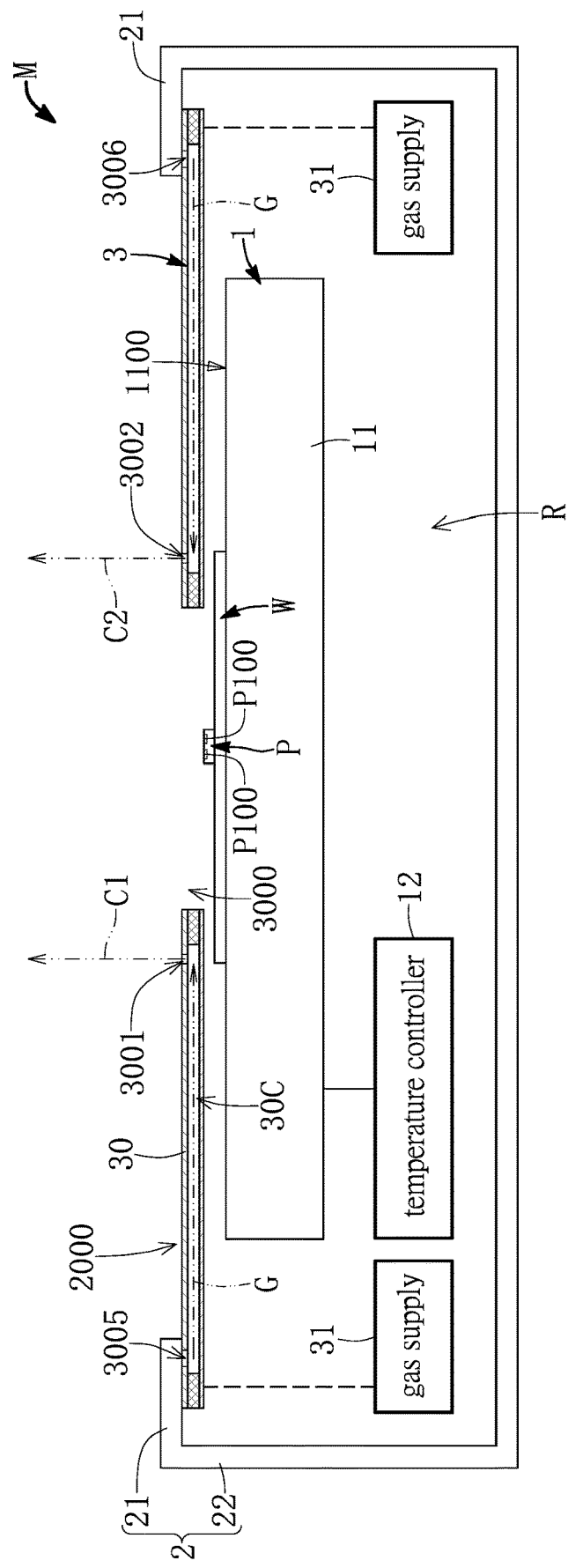
FIG. 14 is a schematic diagram of a machine apparatus according to a second embodiment of the present invention.
Figure 15:
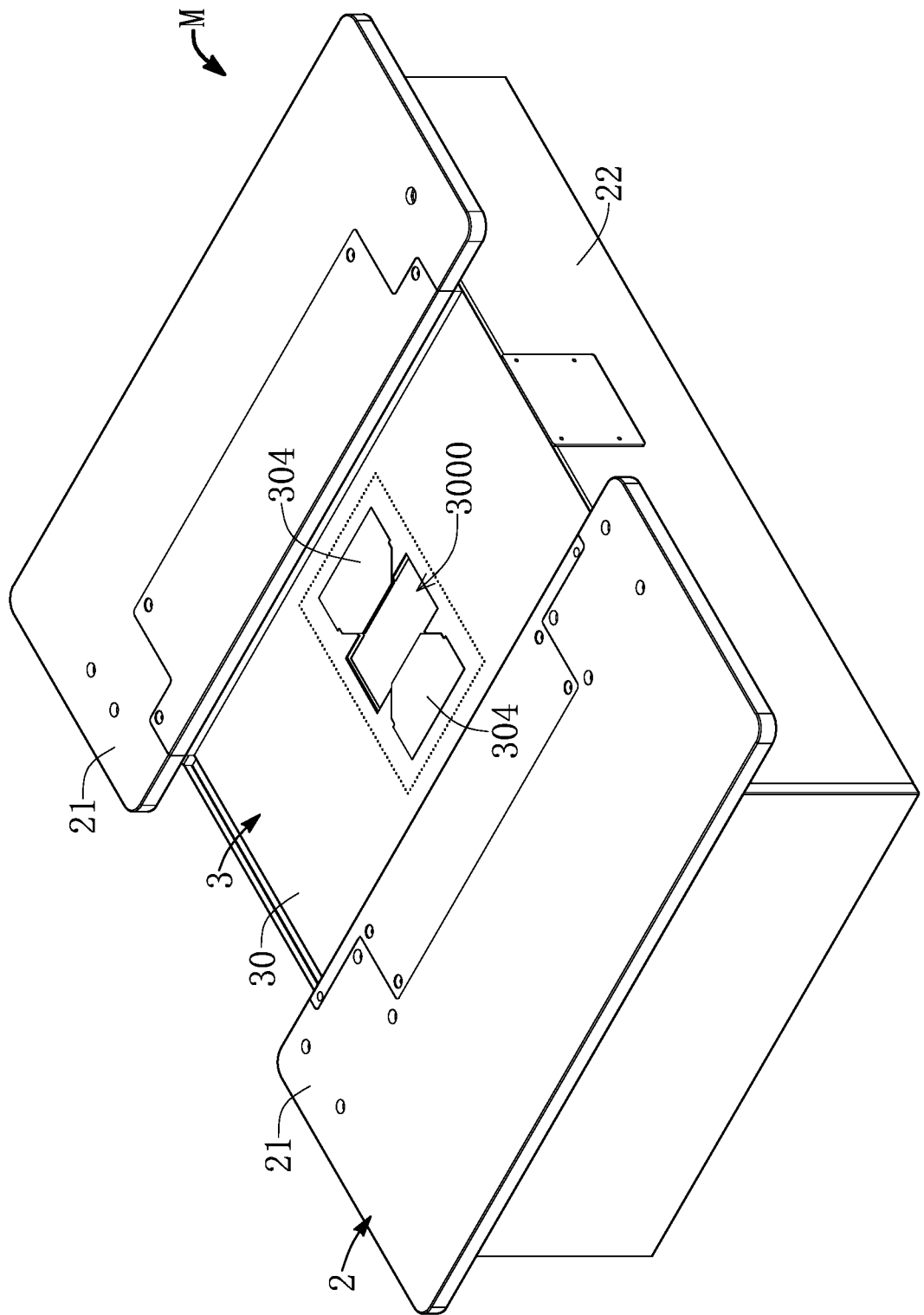
FIG. 15 is a schematic perspective view of the machine apparatus according to the second embodiment of the present invention.

Referring to FIG. 14 to FIG. 15, a second embodiment of the present disclosure provides a machine apparatus M that is configured for optionally carrying at least one probe assembly 4, and the machine apparatus M includes a temperature control carrier module 1, a machine frame structure 2 and a temperature shielding structure 3 that are the same as the first embodiment. The temperature control carrier module 1 can be configured for carrying at least one predetermined object P. The machine frame structure 2 can be configured for partially covering the temperature control carrier module 1, and the machine frame structure 2 has a frame opening 2000 for exposing the temperature control carrier module 1. The temperature shielding structure 3 can be disposed on the machine frame structure 2 for partially covering the frame opening 2000, and the temperature shielding structure 3 has a detection opening 3000 for exposing the at least one predetermined object P. All or a part of a perpendicular projection of the temperature shielding structure 3 can be on the temperature control carrier module 1, and the temperature shielding structure 3 has a gas guiding channel 30C formed thereinside for allowing a predetermined gas G in the gas guiding channel 30C.

According to the above description, comparing FIG. 14 with FIG. 5, and comparing FIG. 15 with FIG. 6, the main difference between the second embodiment and the first embodiment is as follows: in the second embodiment, the machine apparatus M can be configured for optionally carrying at least one probe assembly 4 (that is to say, the machine apparatus M can be used to carry at least one probe assembly 4 or temporarily not carry any probe assembly 4), so that the machine apparatus M provided by the present disclosure can provide the user with different customized requirements.

Third Embodiment

Figure 16:
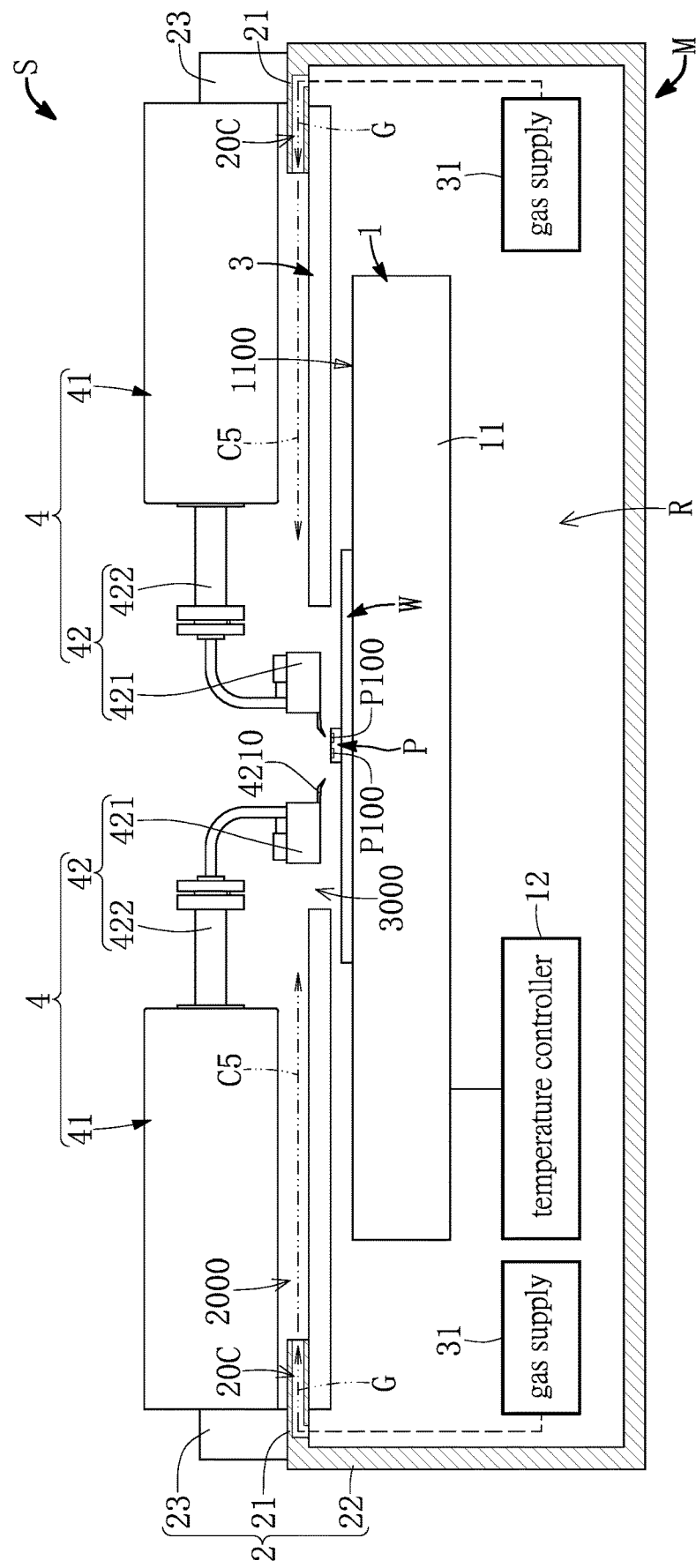
FIG. 16 is a schematic diagram of the probe system using the machine apparatus according to a third embodiment of the present invention.

Referring to FIG. 16, a third embodiment of the present disclosure provides a probe system S using a machine apparatus M that is configured for optionally carrying at least one probe assembly 4, and the machine apparatus M includes a temperature control carrier module 1, a machine frame structure 2 and a temperature shielding structure 3.

Comparing FIG. 16 with FIG. 5, the main difference between the third embodiment and the first embodiment is as follows: in the third embodiment, the machine frame structure 2 has at least one gas transmitting channel 20C (such as two gas transmitting channels 20C shown as an example in FIG. 16) formed thereinside for allowing a predetermined gas G (such as air or any other gases provided by a gas supply 31 or an air supply configured inside or outside the inner accommodating space R of the substrate chuck 11) in the at least one gas transmitting channel 20C. That is to say, the predetermined gas G may not flow in the gas guiding channel 30C of the temperature shielding structure 3 in some operating situations. Therefore, when the predetermined gas G is discharged from the at least one gas transmitting channel 20C (such as a gas discharging outlet communicated with the gas transmitting channel 20C) of the machine frame structure 2 to generate a horizontal gas curtain C5, the horizontal gas curtain C5 can be configured as a horizontal gas barrier formed above the temperature shielding structure 3 (that is to say, the horizontal gas curtain C5 can serve as a horizontal gas barrier between the temperature shielding structure 3 and the frequency extender 41 in the vertical direction). In some examples, as shown in FIG. 16, the two gas transmitting channels 20C can be configured to be formed on the two top platens 21, respectively.

More particularly, the horizontal gas curtain C5 can serve as a horizontal gas barrier between the cold and heat shielding plate 30 and the frequency extender 41 in the vertical direction so as to effectively block or take away (such as airflow generated by blowing) heat or cold radiation radiated from the substrate chuck 11 to the frequency extender 41 through the horizontal gas curtain C5 generated from the at least one gas transmitting channel 20C of the machine frame structure 2. Therefore, the horizontal gas curtain C5 can be configured as a horizontal gas barrier between the cold and heat shielding plate 30 and the frequency extender 41 in the vertical direction so as to reduce or minimize the temperature impact from the substrate chuck 11 to the frequency extender 41, and maintain the measurement accuracy of the probe structure 42 at operating frequencies such as a millimeter wave, sub-THz or THz, etc. In other words, when the predetermined gas G is discharged from the at least one gas transmitting channel 20C of the machine frame structure 2 to generate a horizontal gas curtain C5, the machine frame structure 2 can be configured to generate the horizontal gas curtain C5 (i.e., the horizontal gas barrier) between the cold and heat shielding plate 30 and the frequency extender 41 in the vertical direction so as to reduce or minimize the temperature impact from the substrate chuck 11 to the frequency extender 41, and maintain the measurement accuracy of the probe structure 42 at operating frequencies such as a millimeter wave, sub-THz or THz, etc.

It should be noted that, even if a distance between the probe structure 42 (such as including a probe head and a waveguide) and the frequency extender 41 is decreased or minimized by shortening the waveguide (or the waveguide can be omitted so as to directly mount the probe head on the frequency extender 41), the temperature impact from the substrate chuck 11 to the frequency extender 41 can still be decreased or minimized due to the horizontal gas curtain C5 generated by the machine frame structure 2 between the cold and heat shielding plate 30 and the frequency extender 41 in the vertical direction, thereby maintaining the measurement accuracy of the probe structure 42 at operating frequencies such as a millimeter wave, sub-THz or THz, etc.

It should be noted that, even if the frequency extender 41 is configured to be very close to or contact the cold and heat shielding plate 30 in the vertical direction, the temperature impact from the substrate chuck 11 to the frequency extender 41 can still be decreased or minimized due to the horizontal gas curtain C5 generated by the machine frame structure 2 between the cold and heat shielding plate 30 and the frequency extender 41 in the vertical direction, thereby maintaining the measurement accuracy of the probe structure 42 at operating frequencies such as a millimeter wave, sub-THz or THz, etc.

It should be noted that, for example, like the first embodiment (as shown in FIG. 5 and FIG. 11), the temperature shielding structure 3 provided by the third embodiment further has a gas guiding channel (not shown in FIG. 16) formed thereinside for allowing a predetermined gas G in the gas guiding channel, and the temperature shielding structure 3 can be configured to provide a plurality of gas discharging outlets (not shown in FIG. 16) that is in fluid communication with the gas guiding channel and passes through the upper plate (not shown in FIG. 16). However, the aforementioned details are disclosed for exemplary purposes only, and are not meant to limit the scope of the present disclosure.

Beneficial Effects of the Embodiments

In conclusion, in the probe system and the machine apparatus M provided by the present disclosure, by virtue of the temperature shielding structure 3 having a gas guiding channel 30C formed thereinside for allowing a predetermined gas G in the gas guiding channel 30C, when the predetermined gas G is allowed to flow in the gas guiding channel 30C of the cold and heat shielding plate 30, the cold and heat shielding plate 30 can be configured as the temperature insulator or the temperature barrier between the frequency extender 41 and the substrate chuck 11 in the vertical direction so as to reduce or minimize the temperature impact from the substrate chuck 11 to the frequency extender 41, and maintain the measurement accuracy of the probe structure 42 at operating frequencies such as a millimeter wave, sub-THz or THz, etc.

It should be noted that, even if a distance between the probe structure 42 (such as including a probe head 421 and a waveguide 422) and the frequency extender 41 is decreased or minimized by shortening the waveguide 422 (or the waveguide 422 can be omitted so as to directly mount the probe head 421 on the frequency extender 41), the temperature impact from the substrate chuck 11 to the frequency extender 41 can still be decreased or minimized due to the cold and heat shielding plate 30 between the frequency extender 41 and the substrate chuck 11 in the vertical direction, thereby maintaining the measurement accuracy of the probe structure 42 at operating frequencies such as a millimeter wave, sub-THz or THz, etc.

It should be noted that, even if the frequency extender 41 is configured to be very close to or contact the cold and heat shielding plate 30 in the vertical direction, the temperature impact from the substrate chuck 11 to the frequency extender 41 can still be decreased or minimized due to the cold and heat shielding plate 30 between the frequency extender 41 and the substrate chuck 11 in the vertical direction, thereby maintaining the measurement accuracy of the probe structure 42 at operating frequencies such as a millimeter wave, sub-THz or THz, etc.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe system, comprising:
a temperature control carrier module configured for carrying at least one predetermined object;
a machine frame structure configured for partially covering the temperature control carrier module, wherein the machine frame structure has a frame opening for exposing the temperature control carrier module; and
a temperature shielding structure disposed on the machine frame structure for partially covering the frame opening, wherein the temperature shielding structure has a detection opening for exposing the at least one predetermined object;
wherein, when at least one probe assembly is optionally and detachably disposed above the temperature control carrier module, the at least one probe assembly is configured to optionally contact the at least one predetermined object through the detection opening;
wherein the at least one probe assembly includes a frequency extender and a probe structure for cooperating with the frequency extender;
wherein all or a part of a perpendicular projection of the frequency extender is on the temperature shielding structure, and all or a part of a perpendicular projection of the temperature shielding structure is on the temperature control carrier module;
wherein the temperature shielding structure has a gas guiding channel formed thereinside for allowing a predetermined gas in the gas guiding channel.

2. The probe system according to claim 1,
wherein, the machine frame structure includes two top platens separate from each other, the temperature shielding structure includes a cold and heat shielding plate, and the probe structure includes a probe head having a probe tip, and a waveguide connected between the frequency extender and the probe head;
wherein the cold and heat shielding plate includes a plurality of first gas discharging outlets in fluid communication with the gas guiding channel, the first gas discharging outlets are arranged straightly along a first predetermined direction and arranged in a horizontal direction between the frequency extender and the probe head, and a part of the first gas discharging outlets faces the waveguide of the probe structure;
wherein, when the predetermined gas is discharged from the first gas discharging outlets of the cold and heat shielding plate to generate a first vertical gas curtain, the first vertical gas curtain is formed in the horizontal direction between the frequency extender and the probe head, for reducing the effect of an ambient temperature of an outer space outside the machine frame structure upon an operating temperature of an inner accommodating space inside the machine frame structure, or for reducing the effect of the operating temperature of the inner accommodating space inside the machine frame structure upon the frequency extender;

wherein the cold and heat shielding plate includes an upper plate, a lower plate and a mating plate connected between the upper plate and the lower plate, and the mating plate has an inner surrounding sealing portion, an outer surrounding sealing portion and a plurality of gas channel partitioning portions;

wherein the inner surrounding sealing portion is configured to connect between the upper plate and the lower plate and surround the detection opening, the outer surrounding sealing portion is configured to connect between the upper plate and the lower plate and surround the inner surrounding sealing portion, and the gas channel partitioning portions are configured to connect between the upper plate and the lower plate so as to form the gas guiding channel of the temperature shielding structure;

wherein a part of the gas channel partitioning portions is configured as a plurality of first gas guiding blocks that are arranged along a predetermined direction and partially connected to the outer surrounding sealing portion, a plurality of first spacing distances are each correspondingly formed between two adjacent ones of the first gas guiding blocks, and the first spacing distances are gradually increased toward a direction away from a first gas introducing inlet of the cold and heat shielding plate.

3. The probe system according to claim 2, wherein, when another probe assembly is optionally and detachably disposed above the temperature control carrier module, the another probe assembly is configured to optionally contact the at least one predetermined object through the detection opening;

wherein the another probe assembly includes another frequency extender and another probe structure for cooperating with the another frequency extender, and all or a part of a perpendicular projection of the another frequency extender is on the temperature shielding structure;

wherein the another probe structure includes another probe head having another probe tip, and another waveguide connected between the another frequency extender and the another probe head, the another probe tip of the another probe head is configured for optionally passing the detection opening to contact the at least one predetermined object, and the another waveguide is configured for receiving a predetermined frequency band signal between the another frequency extender and the another probe head;

wherein, when a part of the probe head of the probe structure passes through the detection opening, the probe tip of the probe head is arranged below the detection opening in the vertical direction so as to facilitate contacting a conductive pad of the at least one predetermined object;

wherein, when a part of the another probe head of the another probe structure passes through the detection opening, the another probe tip of the another probe head is arranged below the detection opening in the vertical direction so as to facilitate contacting another conductive pad of the at least one predetermined object.

4. The probe system according to claim 3, wherein the cold and heat shielding plate includes a plurality of second gas discharging outlets in fluid communication with the gas guiding channel, the second gas discharging outlets are arranged straightly along a second predetermined direction and arranged in the horizontal direction between the another frequency extender and the another probe head, and a part of the second gas discharging outlets faces the another waveguide of the another probe structure;

wherein, when the predetermined gas is discharged from the second gas discharging outlets of the cold and heat shielding plate to generate a second vertical gas curtain, the second vertical gas curtain is formed in the horizontal direction between the another frequency extender and the another probe head, for reducing the effect of the ambient temperature of the outer space outside the machine frame structure upon the operating temperature of the inner accommodating space inside the machine frame structure, or for reducing the effect of the operating temperature of the inner accommodating space inside the machine frame structure upon the another frequency extender;

wherein the cold and heat shielding plate includes a plurality of third gas discharging outlets in fluid communication with the gas guiding channel, and a plurality of fourth gas discharging outlets in fluid communication with the gas guiding channel, the third gas discharging outlets are arranged straightly along a third predetermined direction and arranged in the horizontal direction between the detection opening and one of the two top platens, and the fourth gas discharging outlets are arranged straightly along a fourth predetermined direction and arranged in the horizontal direction between the detection opening and another one of the two top platens;

wherein, when the predetermined gas is discharged from the third gas discharging outlets of the cold and heat shielding plate to generate a third vertical gas curtain, the third vertical gas curtain is formed in the horizontal direction between the detection opening and one of the two top platens;

wherein, when the predetermined gas is discharged from the fourth gas discharging outlets of the cold and heat shielding plate to generate a fourth vertical gas curtain, the fourth vertical gas curtain is formed in the horizontal direction between the detection opening and another one of the two top platens;

wherein, when the first gas discharging outlets, the second gas discharging outlets, the third gas discharging outlets and the fourth gas discharging outlets are configured to be arranged in a surrounding shape to surround the detection opening of the cold and heat shielding plate, the first vertical gas curtain provided by the first gas discharging outlets, the second vertical gas curtain provided by the second gas discharging outlets, the third vertical gas curtain provided by the third gas discharging outlets and the fourth vertical gas curtain provided by the fourth gas discharging outlets are configured as a surrounding gas barrier for surrounding the detection opening of the cold and heat shielding plate so as to separate the inner accommodating space inside the machine frame structure and the outer space outside the machine frame structure from each other;

wherein another part of the gas channel partitioning portions is configured as a plurality of second gas guiding blocks that are arranged along another predetermined direction and partially connected to the outer surrounding sealing portion, a plurality of second spacing distances are each correspondingly formed between two adjacent ones of the second gas guiding blocks, and the second spacing distances are gradually increased toward a direction away from a second gas introducing inlet of the cold and heat shielding plate.

5. The probe system according to claim 1,
wherein the temperature shielding structure includes a cold and heat shielding plate, and the cold and heat shielding plate includes an upper plate, a lower plate, and a mating plate connected between the upper plate and the lower plate;
wherein the upper plate has an upper opening, the lower plate has a lower opening, the mating plate has a mating opening formed between the upper opening and the lower opening, and the upper opening, the mating opening and the lower opening are in fluid communication with each other to form the detection opening of the cold and heat shielding plate;
wherein both the upper opening of the upper plate and the mating opening of the mating plate are larger than the lower opening of the lower plate, so that a surrounding carrier portion of the lower plate is exposed by the upper opening of the upper plate and the mating opening of the mating plate;
wherein the cold and heat shielding plate includes a plurality of opening cover plates that can be optionally and detachably disposed thereon so as to partially cover the detection opening of the cold and heat shielding plate;
wherein, when the opening cover plate is detachably disposed on the surrounding carrier portion of the lower plate, a shape and a size of the detection opening of the cold and heat shielding plate are changed by the opening cover plate.

6. The probe system according to claim 1,
wherein the temperature control carrier module includes a substrate chuck disposed in an inner accommodating space of the machine frame structure, and a temperature controller configured for heating or cooling the substrate chuck, and the substrate chuck has a support surface extending to a position below the temperature shielding structure for supporting a carrier substrate that has carried the at least one predetermined object;
wherein the machine frame structure includes two top platens separate from each other, and a surrounding casing surroundingly connected to the two top platens, the frame opening is formed between the two top platens, the two top platens are arranged above the surrounding casing for partially covering the surrounding casing in a vertical direction, and the surrounding casing is arranged around the substrate chuck for surrounding the substrate chuck in the horizontal direction;
wherein the temperature shielding structure includes a cold and heat shielding plate arranged between the two top platens and on the surrounding casing, the cold and heat shielding plate has an upper surface, a lower surface opposite to the upper surface, and the detection opening connected between the upper surface and the lower surface, and the cold and heat shielding plate is configured as a temperature barrier between the frequency extender and the substrate chuck in the vertical direction;
wherein the at least one probe assembly is movable relative to the at least one predetermined object by driving an operable mechanism that is detachably disposed on the machine frame structure, the probe structure includes a probe head having a probe tip, and a waveguide connected between the frequency extender and the probe head, the probe tip of the probe head is configured for optionally passing the detection opening to contact the at least one predetermined object, and the waveguide is configured for transmitting a predetermined frequency band signal between the frequency extender and the probe head;
wherein, when a part of the probe head of the probe structure passes through the detection opening, the probe tip of the probe head is arranged below the detection opening in the vertical direction so as to facilitate contacting a conductive pad of the at least one predetermined object;
wherein, when heat radiation that is generated by heating the substrate chuck through the temperature controller is radiated to the cold and heat shielding plate, a temperature of the cold and heat shielding plate is decreased by flowing of the predetermined gas in the gas guiding channel.

7. The probe system according to claim 1, wherein the temperature shielding structure includes an upper plate and a plurality of gas discharging outlets in fluid communication with the gas guiding channel, and the gas discharging outlets are configured to pass through the upper plate.

8. The probe system according to claim 7, wherein the gas discharging outlets are arranged as a predetermined surrounding shape around the detection opening of the temperature shielding structure.

9. The probe system according to claim 7, wherein some of the gas discharging outlets are arranged in a horizontal direction between the frequency extender and a probe head of the probe structure.

10. A machine apparatus being configured for optionally carrying at least one probe assembly, characterized in that the machine apparatus comprises:
a temperature control carrier module configured for carrying at least one predetermined object;
a machine frame structure configured for partially covering the temperature control carrier module, wherein the machine frame structure has a frame opening for exposing the temperature control carrier module; and
a temperature shielding structure disposed on the machine frame structure for partially covering the frame opening, wherein the temperature shielding structure has a detection opening for exposing the at least one predetermined object;
wherein all or a part of a perpendicular projection of the temperature shielding structure is on the temperature control carrier module;
wherein the temperature shielding structure has a gas guiding channel formed thereinside for allowing a predetermined gas in the gas guiding channel.

11. The machine apparatus according to claim 10,
wherein, the machine frame structure includes two top platens separate from each other, and the temperature shielding structure includes a cold and heat shielding plate;
wherein the cold and heat shielding plate includes a plurality of first gas discharging outlets in fluid communication with the gas guiding channel, and the first gas discharging outlets are arranged straightly along a first predetermined direction;
wherein, when the predetermined gas is discharged from the first gas discharging outlets of the cold and heat shielding plate to generate a first vertical gas curtain, the first vertical gas curtain provided by the first gas discharging outlets is configured for reducing the effect of an ambient temperature of an outer space outside the machine frame structure upon an operating temperature of an inner accommodating space inside the machine frame structure;

wherein the cold and heat shielding plate includes an upper plate, a lower plate and a mating plate connected between the upper plate and the lower plate, and the mating plate has an inner surrounding sealing portion, an outer surrounding sealing portion and a plurality of gas channel partitioning portions;

wherein the inner surrounding sealing portion is configured to connect between the upper plate and the lower plate and surround the detection opening, the outer surrounding sealing portion is configured to connect between the upper plate and the lower plate and surround the inner surrounding sealing portion, and the gas channel partitioning portions are configured to connect between the upper plate and the lower plate so as to form the gas guiding channel of the temperature shielding structure;

wherein a part of the gas channel partitioning portions is configured as a plurality of first gas guiding blocks that are arranged along a predetermined direction and partially connected to the outer surrounding sealing portion, a plurality of first spacing distances are each correspondingly formed between two adjacent ones of the first gas guiding blocks, and the first spacing distances are gradually increased toward a direction away from a first gas introducing inlet of the cold and heat shielding plate.

12. The machine apparatus according to claim 11,
wherein the cold and heat shielding plate includes a plurality of second gas discharging outlets in fluid communication with the gas guiding channel, and the second gas discharging outlets are arranged straightly along a second predetermined direction;

wherein, when the predetermined gas is discharged from the second gas discharging outlets of the cold and heat shielding plate to generate a second vertical gas curtain, the second vertical gas curtain provided by the second gas discharging outlets is configured for reducing the effect of the ambient temperature of the outer space outside the machine frame structure upon the operating temperature of the inner accommodating space inside the machine frame structure;

wherein the cold and heat shielding plate includes a plurality of third gas discharging outlets in fluid communication with the gas guiding channel, and a plurality of fourth gas discharging outlets in fluid communication with the gas guiding channel, the third gas discharging outlets are arranged straightly along a third predetermined direction and arranged in the horizontal direction between the detection opening and one of the two top platens, and the fourth gas discharging outlets are arranged straightly along a fourth predetermined direction and arranged in the horizontal direction between the detection opening and another one of the two top platens;

wherein, when the predetermined gas is discharged from the third gas discharging outlets of the cold and heat shielding plate to generate a third vertical gas curtain, the third vertical gas curtain is formed in the horizontal direction between the detection opening and one of the two top platens;

wherein, when the predetermined gas is discharged from the fourth gas discharging outlets of the cold and heat shielding plate to generate a fourth vertical gas curtain, the fourth vertical gas curtain is formed in the horizontal direction between the detection opening and another one of the two top platens;

wherein, when the first gas discharging outlets, the second gas discharging outlets, the third gas discharging outlets and the fourth gas discharging outlets are configured to be arranged in a surrounding shape to surround the detection opening of the cold and heat shielding plate, the first vertical gas curtain provided by the first gas discharging outlets, the second vertical gas curtain provided by the second gas discharging outlets, the third vertical gas curtain provided by the third gas discharging outlets and the fourth vertical gas curtain provided by the fourth gas discharging outlets are configured as a surrounding gas barrier for surrounding the detection opening of the cold and heat shielding plate so as to separate the inner accommodating space inside the machine frame structure and the outer space outside the machine frame structure from each other;

wherein another part of the gas channel partitioning portions is configured as a plurality of second gas guiding blocks that are arranged along another predetermined direction and partially connected to the outer surrounding sealing portion, a plurality of second spacing distances are each correspondingly formed between two adjacent ones of the second gas guiding blocks, and the second spacing distances are gradually increased toward a direction away from a second gas introducing inlet of the cold and heat shielding plate.

13. The machine apparatus according to claim 10,
wherein the temperature shielding structure includes a cold and heat shielding plate, and the cold and heat shielding plate includes an upper plate, a lower plate, and a mating plate connected between the upper plate and the lower plate;

wherein the upper plate has an upper opening, the lower plate has a lower opening, the mating plate has a mating opening formed between the upper opening and the lower opening, and the upper opening, the mating opening and the lower opening are in fluid communication with each other to form the detection opening of the cold and heat shielding plate;

wherein both the upper opening of the upper plate and the mating opening of the mating plate are larger than the lower opening of the lower plate, so that a surrounding carrier portion of the lower plate is exposed by the upper opening of the upper plate and the mating opening of the mating plate;

wherein the cold and heat shielding plate includes a plurality of opening cover plates that can be optionally and detachably disposed thereon so as to partially cover the detection opening of the cold and heat shielding plate;

wherein, when the opening cover plate is detachably disposed on the surrounding carrier portion of the lower plate, a shape and a size of the detection opening of the cold and heat shielding plate are changed by the opening cover plate.

14. The machine apparatus according to claim 10,
wherein the temperature control carrier module includes a substrate chuck disposed in an inner accommodating space of the machine frame structure, and a temperature controller configured for heating or cooling the substrate chuck, and the substrate chuck has a support surface extending to a position below the temperature shielding structure for supporting a carrier substrate that has carried the at least one predetermined object;

wherein the machine frame structure includes two top platens separate from each other, and a surrounding casing surroundingly connected to the two top platens, the frame opening is formed between the two top platens, the two top platens are arranged above the surrounding casing for partially covering the surrounding casing in a vertical direction, and the surrounding casing is arranged around the substrate chuck for surrounding the substrate chuck in the horizontal direction;

wherein the temperature shielding structure includes a cold and heat shielding plate arranged between the two top platens and on the surrounding casing, the cold and heat shielding plate has an upper surface, a lower surface opposite to the upper surface, and the detection opening connected between the upper surface and the lower surface, and the cold and heat shielding plate is configured as a temperature barrier between an electronic device and the substrate chuck in the vertical direction;

wherein, when heat radiation that is generated by heating the substrate chuck through the temperature controller is radiated to the cold and heat shielding plate, a temperature of the cold and heat shielding plate is decreased by flowing of the predetermined gas in the gas guiding channel.

15. The machine apparatus according to claim 10, wherein the temperature shielding structure includes an upper plate and a plurality of gas discharging outlets in fluid communication with the gas guiding channel, and the gas discharging outlets are configured to pass through the upper plate.

16. The machine apparatus according to claim 15, wherein the gas discharging outlets are arranged as a predetermined surrounding shape around the detection opening of the temperature shielding structure.

17. The machine apparatus according to claim 15, wherein some of the gas discharging outlets are arranged in a horizontal direction between the frequency extender and a probe head of the probe structure.

\* \* \* \* \*